United States Patent
Mizutani

(10) Patent No.: US 7,344,821 B2
(45) Date of Patent: Mar. 18, 2008

(54) POSITIVE RESIST COMPOSITION FOR USE WITH ELECTRON BEAM, EUV LIGHT OR X RAY, AND PATTERN FORMATION METHOD USING THE SAME

(75) Inventor: Kazuyoshi Mizutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 114 days.

(21) Appl. No.: 11/090,864

(22) Filed: Mar. 28, 2005

(65) Prior Publication Data

US 2005/0221224 A1    Oct. 6, 2005

(30) Foreign Application Priority Data

Mar. 26, 2004    (JP)    ............................ P2004-092091

(51) Int. Cl.
*G03F 7/039* (2006.01)
*G03F 7/30* (2006.01)

(52) U.S. Cl. ................... 430/270.1; 430/326; 430/967; 430/966; 430/296; 430/921; 430/914

(58) Field of Classification Search .................... None
See application file for complete search history.

(56) References Cited

U.S. PATENT DOCUMENTS

| 2002/0012871 A1* | 1/2002 | Hatakeyama et al. | 430/270.1 |
| 2002/0081524 A1* | 6/2002 | Uetani et al. | 430/270.1 |
| 2002/0090572 A1* | 7/2002 | Sooriyakumaran et al. | 430/271.1 |
| 2003/0165773 A1* | 9/2003 | Harada et al. | 430/270.1 |
| 2003/0194650 A1* | 10/2003 | Kanna et al. | 430/270.1 |
| 2003/0219679 A1* | 11/2003 | Sasaki et al. | 430/270.1 |
| 2004/0005512 A1* | 1/2004 | Mizutani et al. | 430/270.1 |
| 2004/0197708 A1* | 10/2004 | Kodama | 430/311 |
| 2006/0275701 A1* | 12/2006 | DiPietro et al. | 430/270.1 |

FOREIGN PATENT DOCUMENTS

| EP | 1 367 440 A2 | 12/2003 |
| EP | 1 462 858 A1 | 9/2004 |
| JP | 2003-40840 A | 2/2003 |
| JP | 2003-140342 A | 5/2003 |
| JP | 2003-140361 A | 5/2003 |
| JP | 2004-4227 A | 1/2004 |

OTHER PUBLICATIONS

"ultraviolet." Wikipedia, the free encyclopedia. Sep. 11, 2006. Reference.com http://www.reference.com/browse/wiki/Ultraviolet>>.*

Vaishali R. Vohra et al., "Highly Transparent Resist Platforms for 157 nm Microlithography: An Update" (2002) Proceedings of SPIE, vol. 4690, pp. 84-93.

European Search Report dated Aug. 3, 2005.

* cited by examiner

*Primary Examiner*—Cynthia Hamilton
(74) *Attorney, Agent, or Firm*—Sughrue Mion, PLLC

(57) ABSTRACT

A positive resist composition for use with an electron beam, an EUV light or an X ray, the positive resist composition comprising: (A) at least one compound that generates an acid upon treatment with one of an actinic ray and radiation; and (B) a resin that increases a solubility of the resin (B) in an alkaline developer by an action of an acid, wherein the resin (B) comprises a repeating unit having an alicyclic group connected with a fluorine-substituted alcohol residue; and a pattern formation method using the composition.

7 Claims, No Drawings

POSITIVE RESIST COMPOSITION FOR USE WITH ELECTRON BEAM, EUV LIGHT OR X RAY, AND PATTERN FORMATION METHOD USING THE SAME

BACKGROUND OF THE INVENTION

1. Field of the Invention

The present invention relates to a positive resist composition suitably used in the ultramicrolithography process of producing, for example, VLSI or high-capacity microchip or in other photofabrication processes, and a pattern formation method using the composition. More specifically, the present invention relates to a positive resist composition which can be suitably used for forming a highly refined pattern with use of an electron beam, EUV light or an X ray, and a pattern formation method using the composition.

2. Description of the Related Art

In the process of producing a semiconductor device such as IC and LSI, fine processing by lithography using a resist composition has been performed. Recently, the integration degree of integrated circuits is increasing and formation of an ultrafine pattern in the sub-micron or quarter-micron region is required. To cope with this requirement, the exposure wavelength also tends to become shorter, for example, from g line to i line or further to KrF excimer laser light. At present, other than the excimer laser light, development of lithography using an electron beam, an X ray or EUV light is proceeding.

The electron beam lithography using a positive resist is positioned as a pattern formation technique of the next generation or second next generation and this is a promising technique for the formation of an ultrafine pattern of 150 nm or less but in addition to high sensitivity and high resolution, more improvements are demanded on the pattern profile, line edge roughness, dissolution contrast, inhibition of negative conversion, and surface roughness.

The lithography using an X ray or EUV light also has the same problems and it is necessary to solve these problems.

In the lithography process using an electron beam, an X ray or EUV light, a chemical amplification-type resist utilizing an acid catalytic reaction is mainly used in view of high sensitivity. As for the positive resist, studies are being made on a chemical amplification-type resist composition mainly comprising an acid generator and a resin which is insoluble or sparingly soluble in an alkaline developer but of which solubility in an alkaline developer increases by the action of an acid.

Examples of the positive resist composition include those described in JP-A-2004-4227 (the term "JP-A" as used herein means an "unexamined published Japanese patent application")), JP-A-2003-40840, JP-A-2003-140361 and JP-A-2003-140342.

However, the lithography process in the ultrafine region at present fails in satisfying good pattern profile, line edge roughness, dissolution contrast, surface roughness and prevention of negative conversion, as well as high sensitivity and high resolution.

SUMMARY OF THE INVENTION

An object of the present invention is to solve the problems in the technique of enhancing performances when fine processing of a semiconductor device is performed by using an electron beam, an X ray or EUV light, and provide a positive resist composition and a pattern formation method using the composition, where not only high sensitivity and high resolution but also good pattern profile, line edge roughness, dissolution contrast, surface roughness and prevention of negative conversion are satisfied.

As a result of intensive investigations to achieve the above-described object, the present inventors have accomplished the present invention.

That is, the present invention provides the followings.

(1) A positive resist composition for use with an electron beam, an EUV light or an X ray, the positive resist composition comprising:

(A) at least one compound that generates an acid upon treatment with one of an actinic ray and radiation; and (B) a resin that increases a solubility of the resin (B) in an alkaline developer by an action of an acid, wherein the resin (B) comprises a repeating unit having an alicyclic group connected with a fluorine-substituted alcohol residue.

(2) The positive resist composition as described in (1) above, wherein the alicyclic group is represented by formula (I):

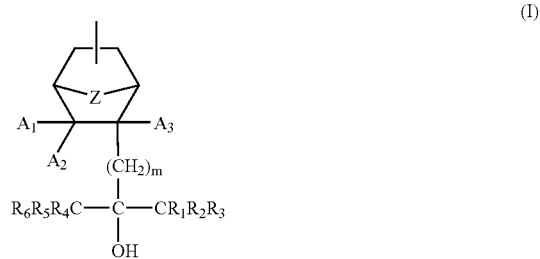

wherein $A_1$ to $A_3$ each independently represents a hydrogen atom, an alkyl group or a fluorine atom;

$R_1$ to $R_6$ each independently represents a hydrogen atom or a fluorine atom, provided that at least one of $R_1$ to $R_6$ represents a fluorine atom;

Z represents an alkylene group, an oxygen atom or a sulfur atom; and m represents an integer of 0 to 2.

(3) The positive resist composition as described in (1) above, wherein the repeating unit is represented by formula (II):

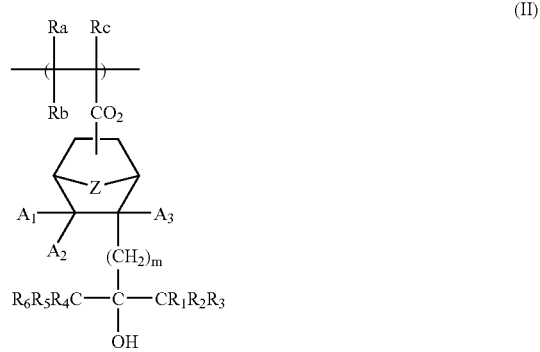

wherein Ra, Rb and Rc each independently represents a hydrogen atom, an alkyl group, a cyano group, a chlorine atom or a fluorine atom;

$A_1$ to $A_3$ each independently represents a hydrogen atom, an alkyl group or a fluorine atom;

$R_1$ to $R_6$ each independently represents a hydrogen atom or a fluorine atom, provided that at least one of $R_1$ to $R_6$ represents a fluorine atom;

Z represents an alkylene group, an oxygen atom or a sulfur atom; and m represents an integer of 0 to 2.

(4) The positive resist composition as described in (2) or (3) above, wherein $R_1$ to $R_6$ each represents a fluorine atom.

(5) The positive resist composition as described in any of (1) to (4) above, wherein the resin (B) further comprises at least one of a repeating unit represented by formula (B1) and a repeating unit represented by formula (B2):

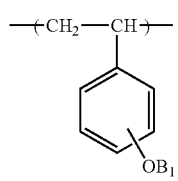

(B1)

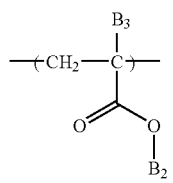

(B2)

wherein $B_1$ and $B_2$ each represents a group capable of decomposing by an action of an acid, or a group including a group capable of decomposing by an action of an acid to generate a carboxyl group or a hydroxyl group; and $B_3$ represents a hydrogen atom, a methyl group, a halogen atom or a cyano group.

(6) The positive resist composition as described in (5) above, wherein $B_1$ and $B_2$ each includes a cyclic structure.

(7) The positive resist composition as described in any of (1) to (6) above, wherein the resin (B) further comprises a repeating unit represented by formula (B3).

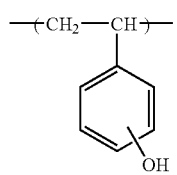

(B3)

(8) A pattern formation method comprising:

forming a resist film from a positive resist composition as described in any of (1) to (7) above;

exposing the resist film with an electron beam, an EUV light or an X ray, so as to form an exposed resist film; and developing the exposed resist film.

(9) The positive resist composition as described in any of (1) to (7) above, which contains said at least one compound (A) in an amount of from 6 to 20% by weight based on a total solid content of the positive resist composition.

(10) The positive resist composition as described in any of (1) to (7) and (9) above, wherein said at least one compound (A) comprises: a compound that generates a sulfonic acid upon treatment with one of an actinic ray and radiation; and a compound that generates a carboxylic acid upon treatment with one of an actinic ray and radiation.

DETAILED DESCRIPTION OF THE INVENTION

The present invention is described in detail below.

In the present invention, when a group (atomic group) is denoted without specifying whether substituted or unsubstituted, the group includes both a group having no substituent and a group having a substituent. For example, an "alkyl group" includes not only an alkyl group having no substituent (unsubstituted alkyl group) but also an alkyl group having a substituent (substituted alkyl group).

[1] Compound of Generating Acid Upon Treatment with Actinic Rays or Radiation (Component A)

The component A is a compound of generating an acid upon treatment with actinic rays or radiation. This is preferably a compound of generating a sulfonic acid upon treatment with actinic rays or radiation (hereinafter, sometimes referred to as a "sulfonic acid generator") and a known compound may be appropriately selected and used. Examples thereof include diazonium salt, phosphonium salt, sulfonium salt, iodonium salt, imidosulfonate, oxime sulfonate, diazodisulfone, disulfone and o-nitrobenzyl sulfonate.

In addition, compounds where the above-described group or compound of generating an acid upon treatment with actinic rays or radiation is introduced into the polymer main or side chain, described, for example, in U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 may also be used. In the present invention, electron beams, EUV light or X rays is used as actinic rays or radiation.

Furthermore, compounds of generating an acid by the action of light, described, for example, in U.S. Pat. No. 3,779,778 and European Patent 126,712 may also be used.

In the present invention, among those sulfonic acid generators, sulfonium salt, iodonium salt, imidosulfonate, oxime sulfonate, diazodisulfone and disulfone are preferred from the standpoint of enhancing the image performance such as resolution and pattern profile.

Examples of particularly preferred sulfonic acid generators are set forth below.

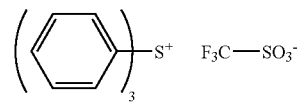

A-1

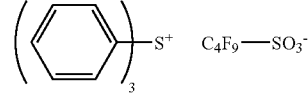

A-2

-continued
A-3
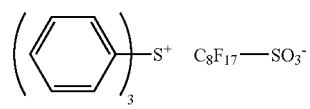
A-4
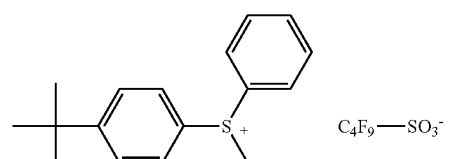
A-5
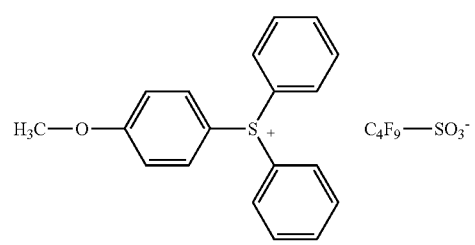
A-6
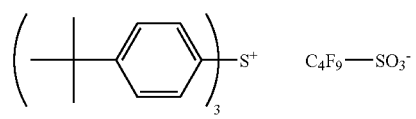
A-7
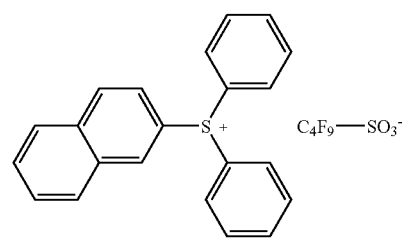
A-8
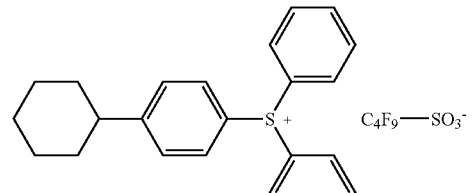
A-9
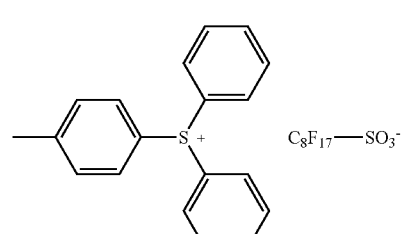
A-10
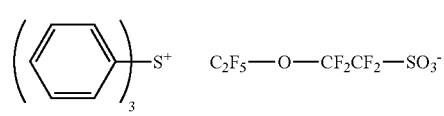
-continued
A-11
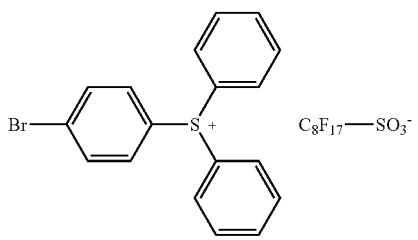
A-12
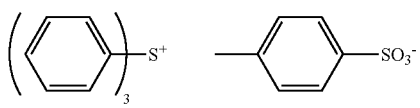
A-13
A-14
A-15
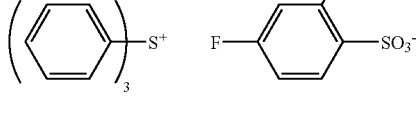
A-16
A-17
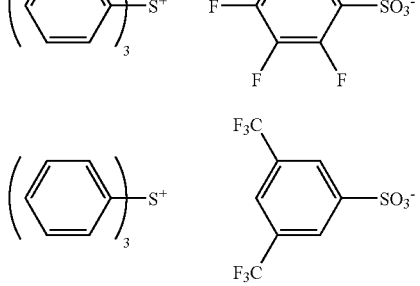
A-18
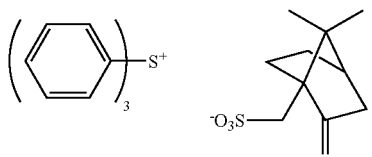
A-19
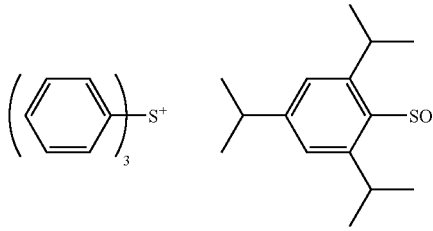

-continued
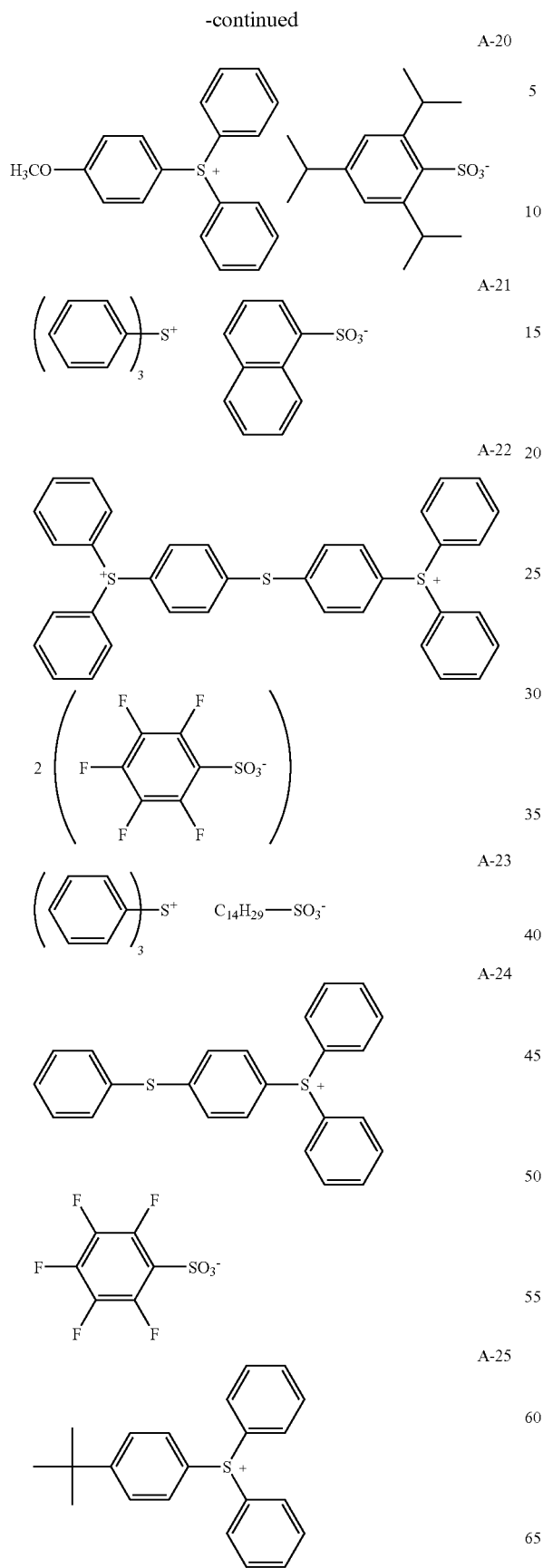
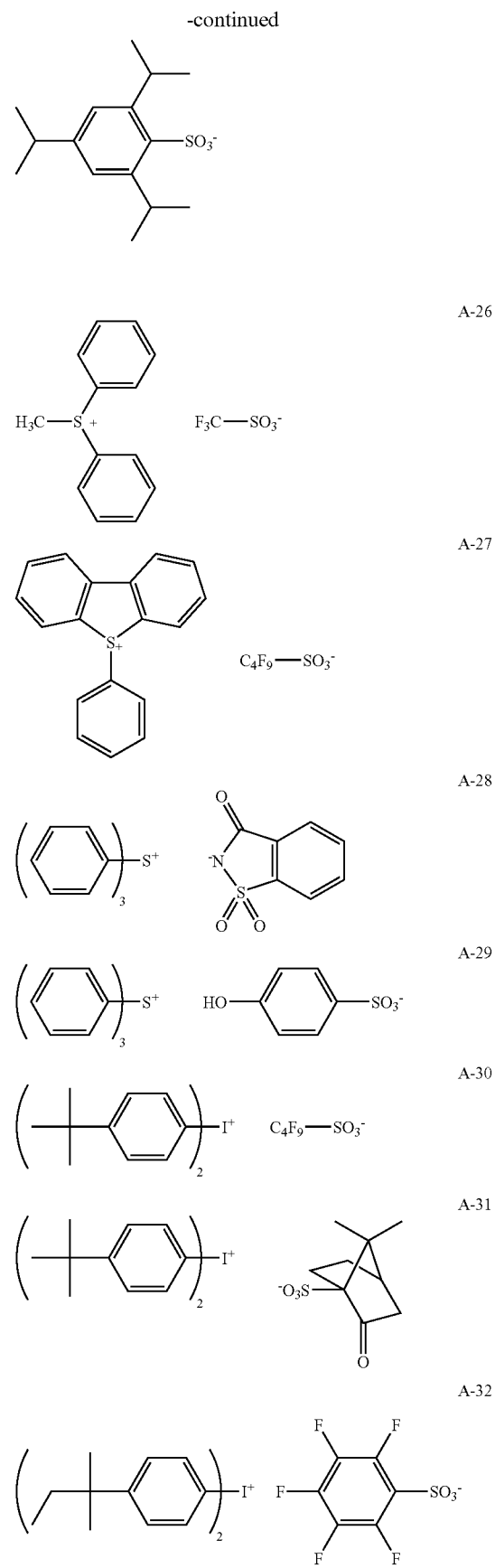

-continued
A-33
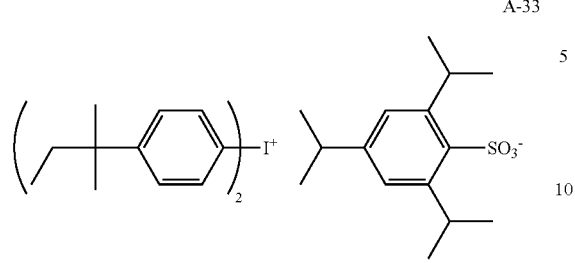
A-34
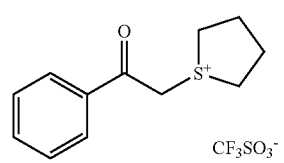
CF₃SO₃⁻
A-35
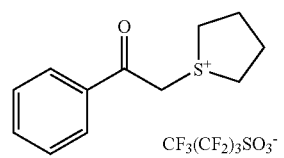
CF₃(CF₂)₃SO₃⁻
A-36
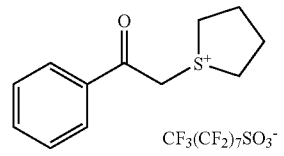
CF₃(CF₂)₇SO₃⁻
A-37
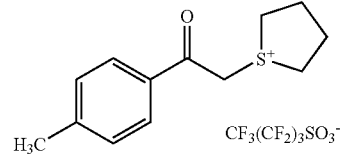
CF₃(CF₂)₃SO₃⁻
A-38
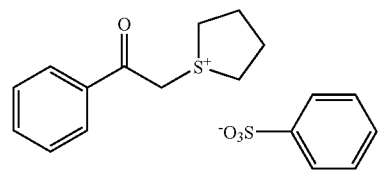
A-39
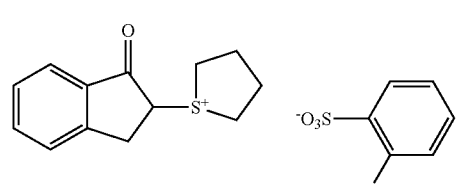
A-40
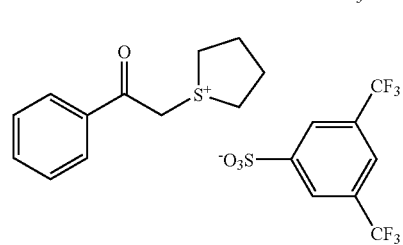
-continued
A-41
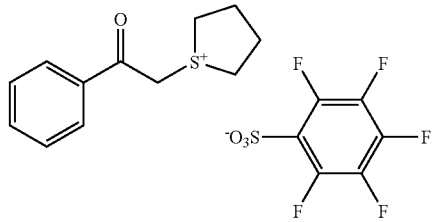
A-42
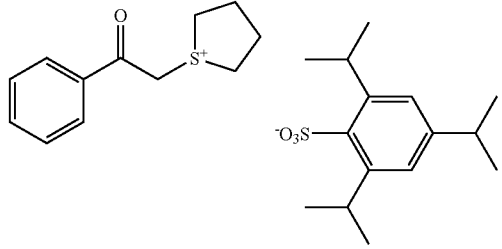
A-43
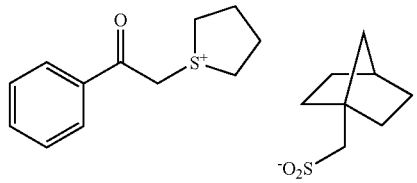
A-44
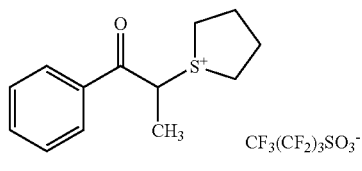
CF₃(CF₂)₃SO₃⁻
A-45
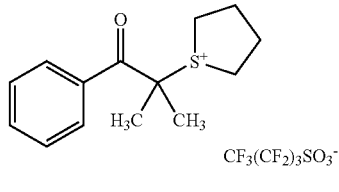
CF₃(CF₂)₃SO₃⁻
A-46
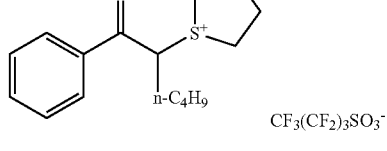
CF₃(CF₂)₃SO₃⁻
A-47
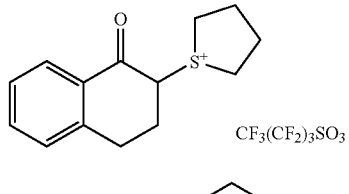
CF₃(CF₂)₃SO₃⁻
A-48
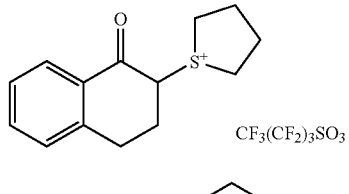
CF₃(CF₂)₃SO₃⁻

-continued

-continued

A-69
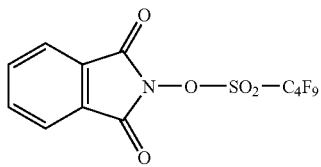

A-70
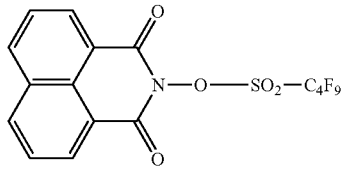

A-71
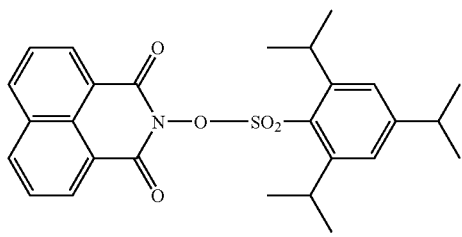

A-72
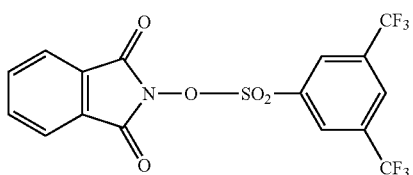

A-73
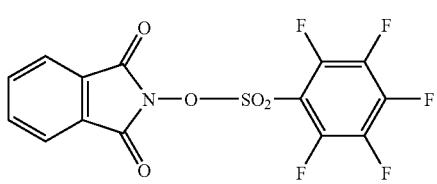

A-74
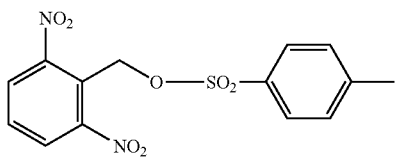

A-75
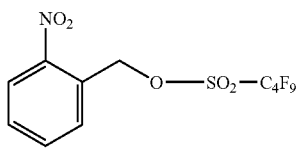

A-76
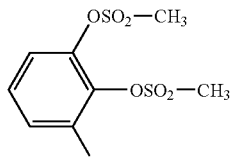

A-77
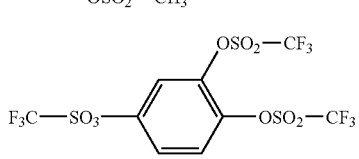

Examples of other preferred organic sulfur anions are set forth below formula.

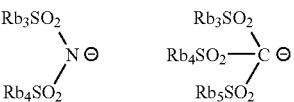

Wherein $Rb_3$, $Rb_4$ and $Rb_5$ each independently represents an organic group. The organic group of $Rb_3$, $Rb_4$ and $Rb_5$ is preferably an organic group having 1 to 30 carbon atom(s) such as an alkyl group, a cycloalkyl group or an aryl group, or a group including a plurality of these groups connected with connection groups such as single bond, —O—, —CO$_2$—, —S—, —SO$_3$—, —SO$_2$N(Rc$_1$)—. In the formula, $Rc_1$ represents a hydrogen atom or an alkyl group. $Rb_3$ and $Rb_4$ may be bonded to form a ring. The group formed by bonding $Rb_3$ and $Rb_4$ is an alkylene group or an arylene group, and preferably a perfluoroalkylene group having 2 to 4 carbon atoms.

The organic group of $Rb_3$ to $Rb_5$ is preferably an alkyl group substituted with a fluorine atom or a fluoroalkyl group on its 1st position, or a phenyl group substituted with a fluorine atom or a fluoroalkyl group, more preferably a perfluoroalkyl group. By containing a fluorine atom or a fluoroalkyl group, the acidity of the acid generated by light irradiation increases so that the sensitivity improves.

Examples of acid generators having organic sulfur anions are set forth below.

A-78
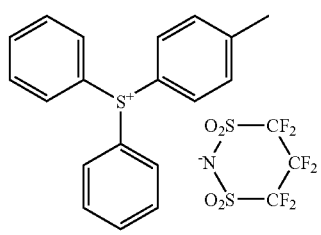

A-79
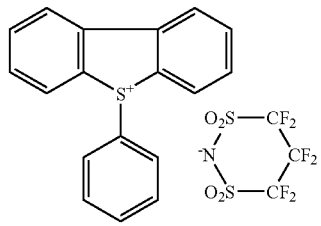

A-80
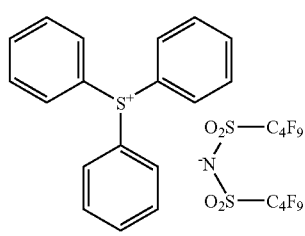

-continued

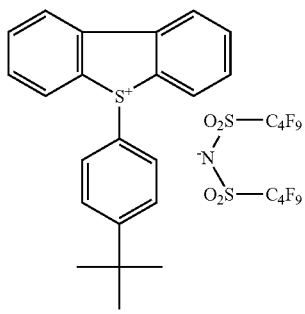

A-81

In the present invention, a compound of generating a carboxylic acid upon treatment with actinic rays or radiation (hereinafter, sometimes referred to as a "carboxylic acid generator") may also be used as the component A.

The carboxylic acid generator is preferably a compound represented by the following formula (AA):

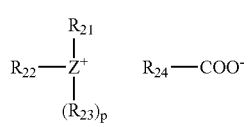

(AA)

wherein $R_{21}$ to $R_{23}$ each independently represents an alkyl group, a cycloalkyl group, an alkenyl group or an aryl group, $R_{24}$ represents a hydrogen atom, an alkyl group, a cycloalkyl group, an alkenyl group or an aryl group, Z represents a sulfur atom or an iodine atom, and p is 1 when Z is a sulfur atom, or p is 0 when Z is an iodine atom.

The alkyl group, cycloalkyl group, alkenyl group and aryl group of $R_{21}$ to $R_{23}$ each includes a group having a substituent.

Examples of the substituent for the alkyl group, cycloalkyl group and alkenyl group include a halogen atom (e.g., chlorine, bromine, fluorine), an aryl group (e.g., phenyl, naphthyl), a hydroxyl group and an alkoxy group (e.g., methoxy, ethoxy, butoxy).

Examples of the substituent for the aryl group include a halogen atom (e.g., chlorine, bromine, fluorine), a nitro group, a cyano group, an alkyl group (e.g., methyl, ethyl, tert-butyl, tert-amyl, octyl), a hydroxyl group and an alkoxy group (e.g., methoxy, ethoxy, butoxy).

$R_{21}$ to $R_{23}$ each independently represents preferably an alkyl group having from 1 to 12 carbon atoms, a cycloalkyl group having from 3 to 12 carbon atoms, an alkenyl group having from 2 to 12 carbon atoms or an aryl group having from 6 to 24 carbon atoms, more preferably an alkyl group having from 1 to 6 carbon atoms, a cycloalkyl group having from 3 to 6 carbon atoms or an aryl group having from 6 to 18 carbon atoms, still more preferably an aryl group having from 6 to 15 carbon atoms. These groups each may have a substituent.

$R_{24}$ represents a hydrogen atom, an alkyl group, a cycloalkyl group, an alkenyl group or an aryl group.

The alkyl group, cycloalkyl group, alkenyl group and aryl group of $R_{24}$ each includes a group having a substituent.

Examples of the substituent for the alkyl group, cycloalkyl group and alkenyl group include those described above as examples of the substituent when $R_{21}$ is an alkyl group. Examples of the substituent for the aryl include those described above as examples of the substituent when $R_{21}$ is an aryl group.

$R_{24}$ is preferably a hydrogen atom, an alkyl group having from 1 to 30 carbon atoms, a cycloalkyl group having from 3 to 30 carbon atoms, an alkenyl group having from 2 to 30 carbon atoms or an aryl group having from 6 to 24 carbon atoms, more preferably an alkyl group having from 1 to 18 carbon atoms, a cycloalkyl group having from 3 to 18 carbon atoms or an aryl group having from 6 to 18 carbon atoms, still more preferably an alkyl group having from 1 to 12 carbon atoms, a cycloalkyl group having from 3 to 12 carbon atoms or an aryl group having from 6 to 15 carbon atoms. These groups each may have a substituent.

Z represents a sulfur atom or an iodine atom. p is 1 when Z is a sulfur atom, or 0 when Z is an iodine atom.

Two or more cation moieties of formula (AA) may combine through a single bond or a linking group (e.g., —S—, —O—) to form a cation structure having a plurality of cation moieties of formula (AA).

Specific preferred examples of the carboxylic acid generator (AA) are set forth below, but the present invention is of course not limited thereto.

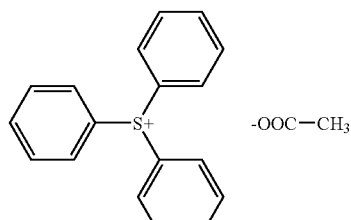

AA-1

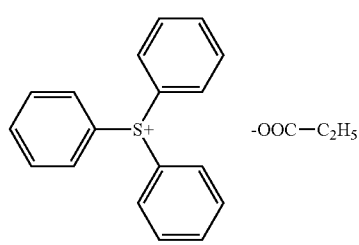

AA-2

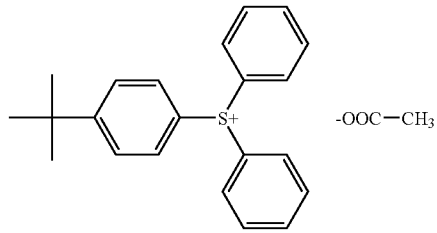

AA-3

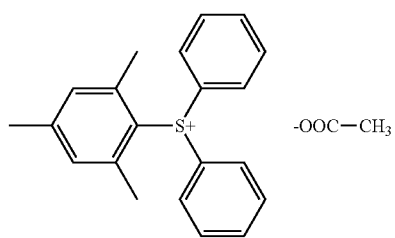

AA-4

-continued
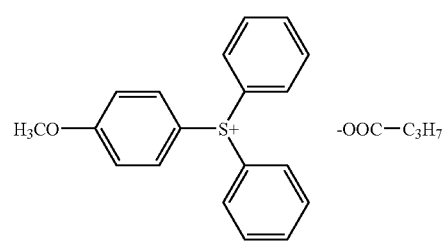 AA-5
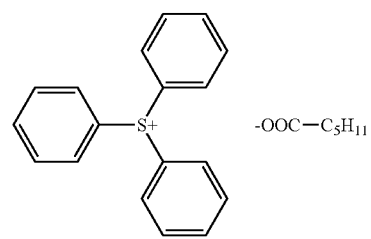 AA-6
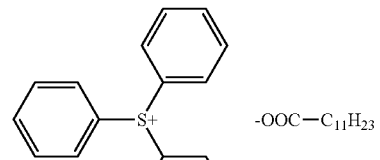 AA-7
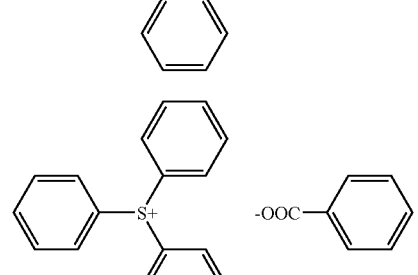 AA-8
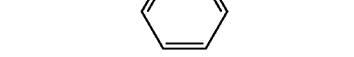 AA-9
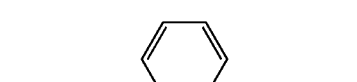 AA-10
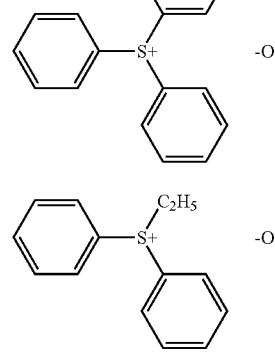 AA-11
-continued
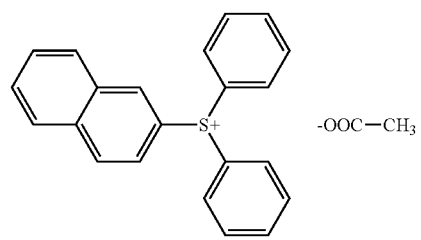 AA-12
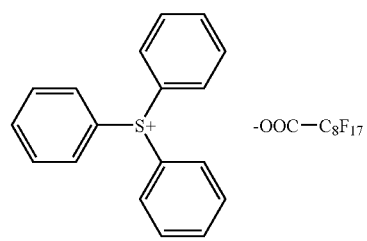 AA-13
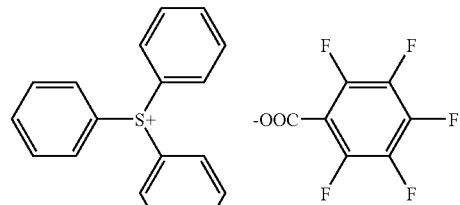 AA-14
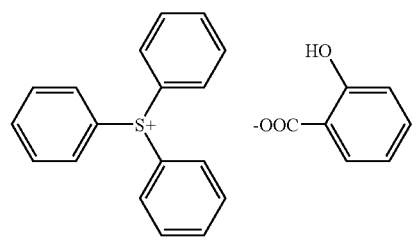 AA-15
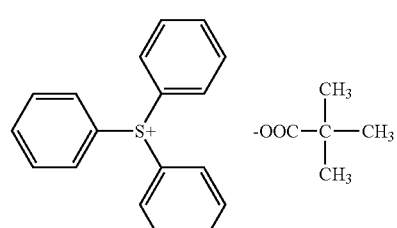 AA-16
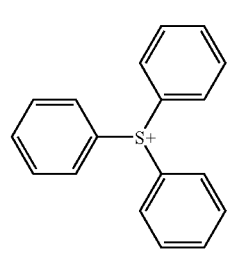 AA-17

-continued

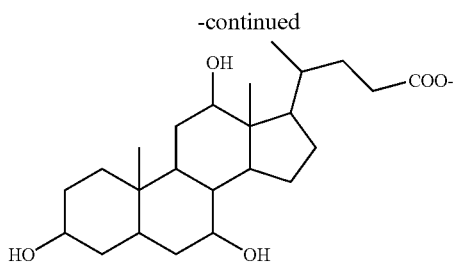

AA-18

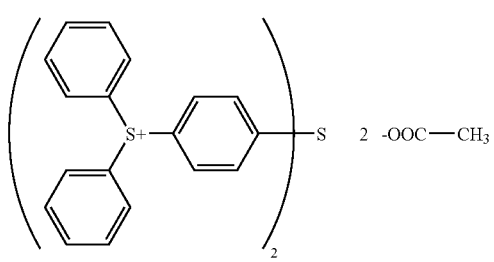

AA-19

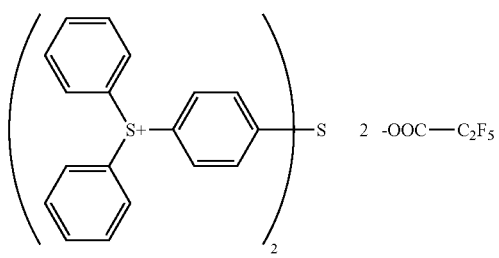

AA-20

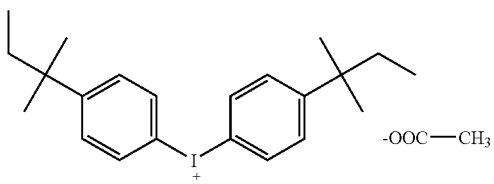

AA-21

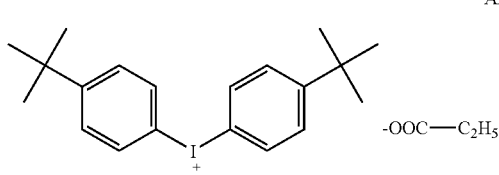

AA-22

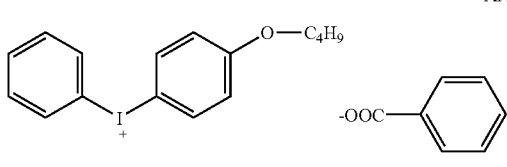

AA-23

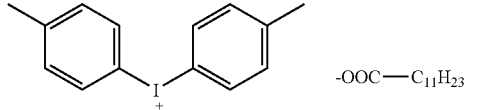

-continued

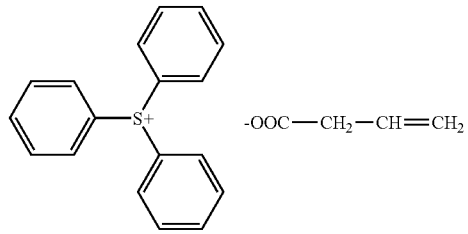

AA-24

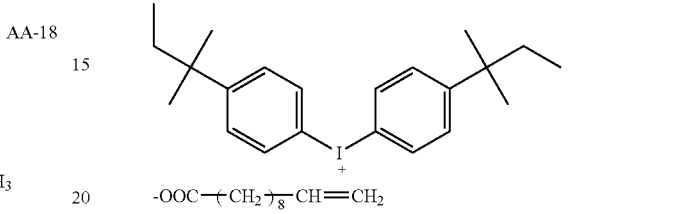

AA-25

The content of the component A in the positive resist composition of the present invention is preferably from 0.1 to 20% by weight, more preferably from 6 to 20% by weight, based on the total solid content of the solvent.

For the component A, one compound may be used or a mixture of two or more compounds may be used.

For the component A, both a compound of generating a sulfonic acid upon treatment with actinic rays or radiation and a compound of generating a carboxylic acid upon treatment with actinic rays or radiation are preferably used in combination.

[2] (B) Resin of Which Solubility in an Alkaline Developer Increases by the Action of an Acid, the Resin Comprising, as at Least One Repeating Unit, a Repeating Unit Having an Alicyclic Group Connected with a Fluorine-Substituted Alcohol Residue The positive resist composition of the present invention comprises a resin of which solubility in an alkaline developer increases by the action of an acid, the resin comprising, as at least one repeating unit, a repeating unit having an alicyclic group connected with a fluorine-substituted alcohol residue (hereinafter sometimes referred to as an "acid-decomposable resin (B)").

The fluorine-substituted alcohol residue as used in the present invention is a group resulting from removing one hydrogen atom from an alcohol (preferably having from 1 to 5 carbon atoms) where at least one hydrogen atom is displaced by a fluorine atom, and this is a group having at least one hydrogen atom and an alcoholic hydroxyl group. The fluorine-substituted alcohol residue includes, for example, a group represented by the following formula (B1):

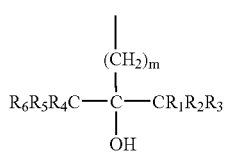

(B1)

wherein $R_1$ to $R_6$ each independently represents a hydrogen atom or a fluorine atom, provided that at least one of $R_1$ to $R_6$ represents a fluorine atom, and m represents an integer of 0 to 2.

In formula (B1), it is preferred that $R_1$ to $R_6$ all are a fluorine atom.

The alicyclic group to which the fluorine-substituted alcohol residue is connected may be monocyclic type or polycyclic type and may have a crosslinked structure. The monocyclic type is preferably an alicyclic group having from 3 to 8 carbon atoms and examples thereof include a cyclopropyl group, a cyclobutyl group, a cyclopentyl group, a cyclohexyl group and a cyclooctyl group. The polycyclic type is preferably an alicyclic group having from 6 to 20 carbon atoms and examples thereof include an adamantyl group, a norbornyl group, an isobornyl group, a camphanyl group, a dicyclopentyl group, an α-pinel group, a tricyclodecanyl group, a tetracyclododecyl group and an androstanyl group. The alicyclic group may further have a substituent in addition to the fluorine-substituted alcohol residue. Examples of the substituent which the alicyclic group may have include an alkyl group and a fluorine atom. The alkyl group may be further substituted by a fluorine atom or the like.

The alicyclic group is preferably a group represented by the following formula (B2):

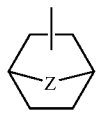

(I)

wherein Z represents an alkylene group (preferably a methylene group), an oxygen atom or a sulfur atom.

The alicyclic group connected with a fluorine-substituted alcohol residue is preferably represented by the following formula (I):

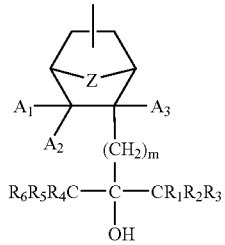

(I)

wherein $A_1$ to $A_3$ each independently represents a hydrogen atom, an alkyl group or a fluorine atom, $R_1$ to $R_6$ each independently represents a hydrogen atom or a fluorine atom, provided that at least one of $R_1$ to $R_6$ represents a fluorine atom, Z represents an alkylene group, an oxygen atom or a sulfur atom, and m represents an integer of 0 to 2.

$R_1$ to $R_6$ and m in formula (I) have the same meanings as $R_1$ to $R_6$ and m in formula (B1).

Z in formula (I) has the same meaning as Z in formula (B2).

In formula (I), the alkyl group of $A_1$ to $A_3$ is preferably a linear or branched alkyl group having from 1 to 5 carbon atoms and examples thereof include a methyl group, an ethyl group, a propyl group, an n-butyl group, a sec-butyl group and a tert-butyl group. The alkyl group of $A_1$ to $A_3$ may be substituted by a fluorine atom or the like.

Specific examples of the alicyclic group connected with a fluorine-substituted alcohol residue are set forth below, but the present invention is not limited thereto.

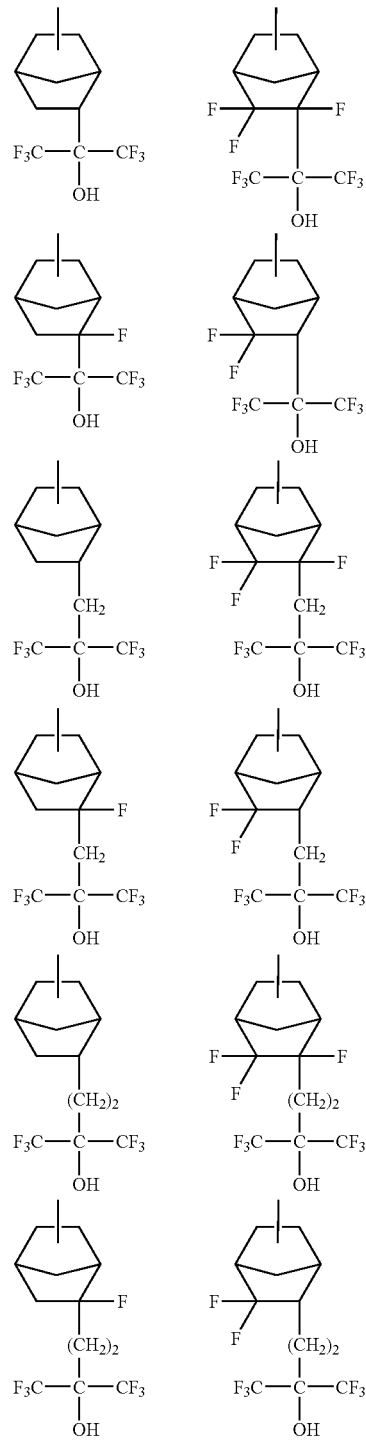

-continued

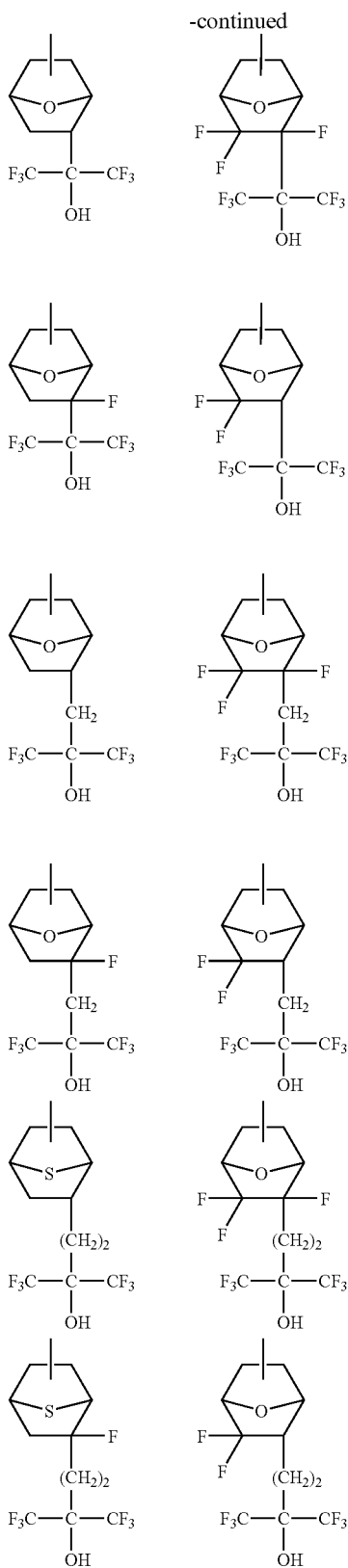

The repeating unit having an alicyclic group connected with a fluorine-substituted alcohol residue is preferably represented by the following formula (II):

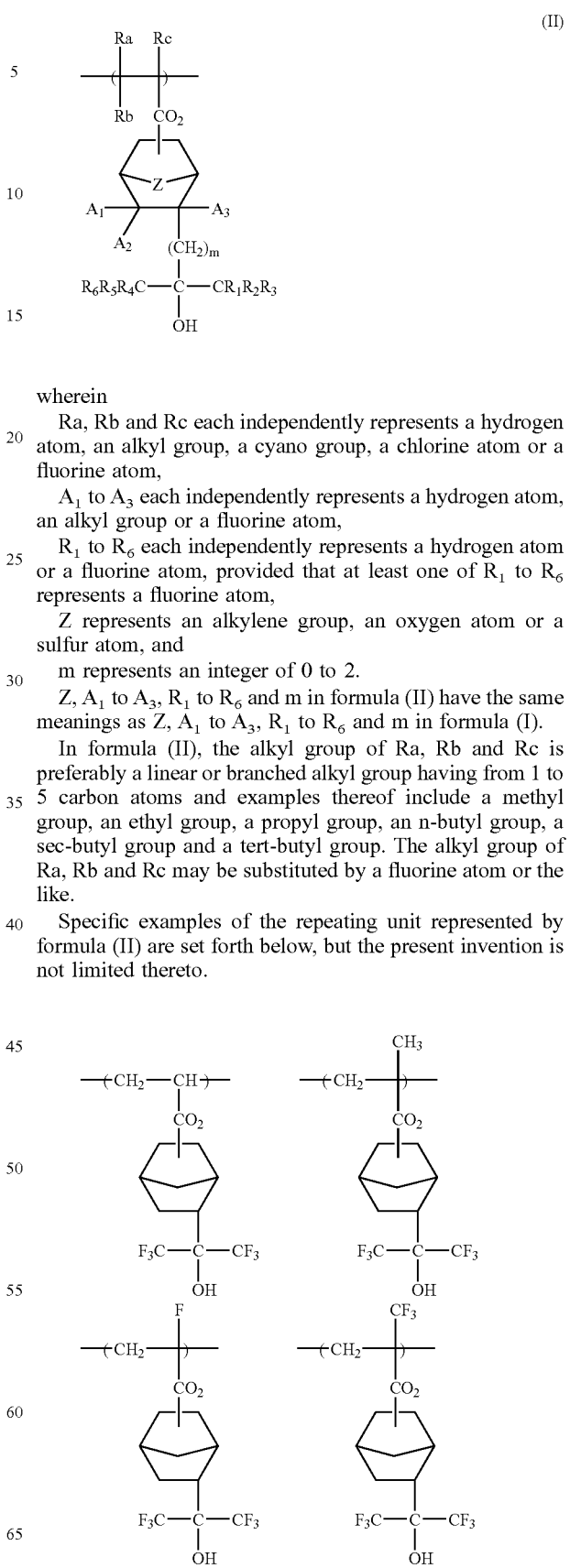

wherein
Ra, Rb and Rc each independently represents a hydrogen atom, an alkyl group, a cyano group, a chlorine atom or a fluorine atom, $A_1$ to $A_3$ each independently represents a hydrogen atom, an alkyl group or a fluorine atom, $R_1$ to $R_6$ each independently represents a hydrogen atom or a fluorine atom, provided that at least one of $R_1$ to $R_6$ represents a fluorine atom, Z represents an alkylene group, an oxygen atom or a sulfur atom, and m represents an integer of 0 to 2.

Z, $A_1$ to $A_3$, $R_1$ to $R_6$ and m in formula (II) have the same meanings as Z, $A_1$ to $A_3$, $R_1$ to $R_6$ and m in formula (I).

In formula (II), the alkyl group of Ra, Rb and Rc is preferably a linear or branched alkyl group having from 1 to 5 carbon atoms and examples thereof include a methyl group, an ethyl group, a propyl group, an n-butyl group, a sec-butyl group and a tert-butyl group. The alkyl group of Ra, Rb and Rc may be substituted by a fluorine atom or the like.

Specific examples of the repeating unit represented by formula (II) are set forth below, but the present invention is not limited thereto.

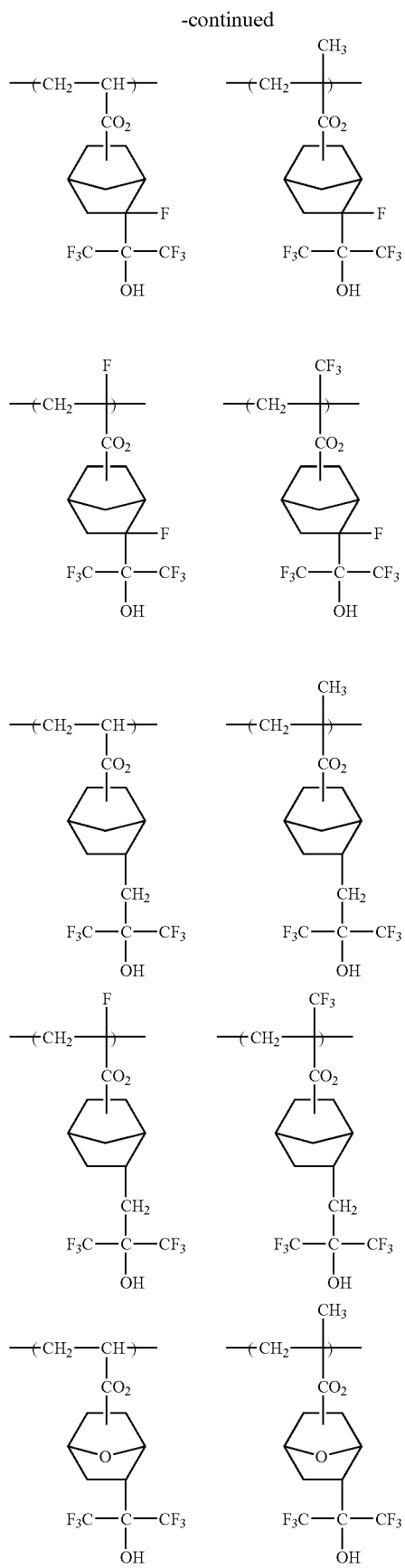
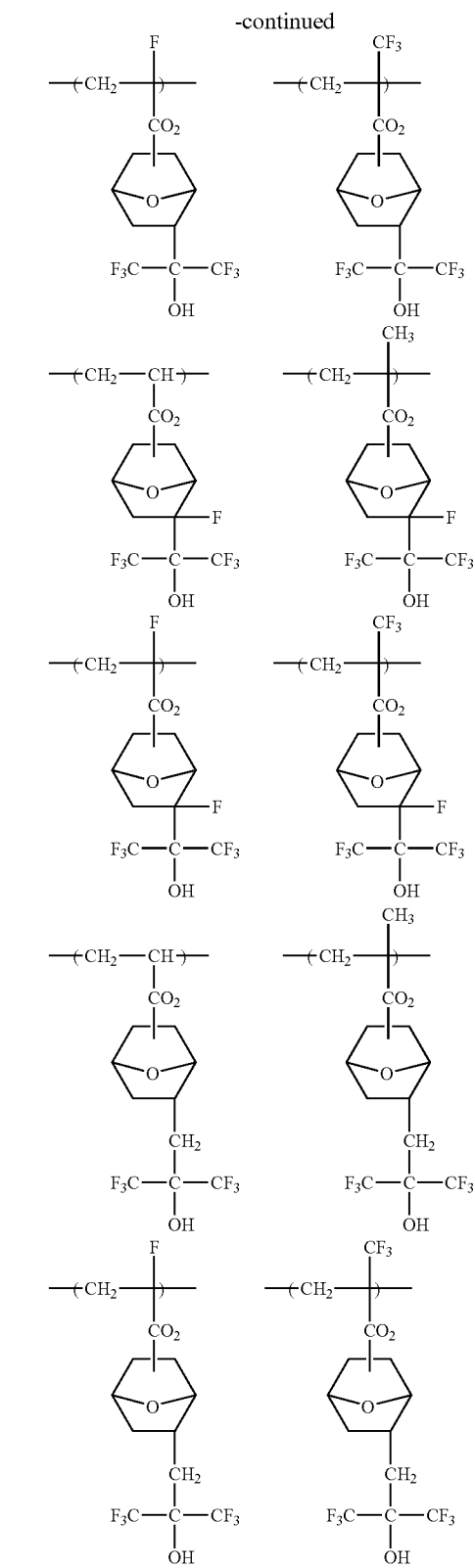
The acid-decomposable resin (B) preferably comprises at least one repeating unit selected from a repeating unit represented by the following formula (B1) and a repeating unit represented by formula (B2):

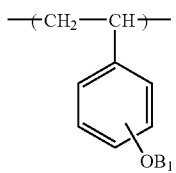

(B1)

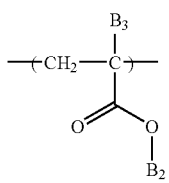

(B2)

wherein $B_1$ and $B_2$ each represents a group capable of decomposing by an action of an acid, from the oxygen atom that $B_1$ or $B_2$ is connected to, or a group including a group capable of decomposing by an action of an acid to generate a carboxyl group or a hydroxyl group, and $B_3$ represents a hydrogen atom, a methyl group, a halogen atom or a cyano group.

In formula (B1), the benzene ring may further have a substituent such as hydroxyl group, halogen atom, cyano group, nitro group, acyl group and acyloxy group.

Examples of the halogen atom include a fluorine atom, a chlorine atom, a bromine atom and an iodine atom.

The acyl group is preferably an acyl group having from 1 to 8 carbon atoms and examples thereof include a formyl group, an acetyl group, a propanoyl group, a butanoyl group, a pivaloyl group and a benzoyl group.

The acyloxy group is preferably an acyloxy group having from 2 to 8 carbon atoms and examples thereof include an acetoxy group, a propanoyloxy group, an octanoyloxy group and a benzoyloxy group.

Examples of the group capable of decomposing by the action of an acid represented by $B_1$ in formula (B1) and the group capable of decomposing by the action of an acid represented by $B_2$ in formula (B1) (hereinafter, sometimes referred to as an "acid-decomposable group") include —$C(R_{36})(R_{37})(R_{38})$, —$C(R_{36})(R_{37})(OR_{39})$, —$C(=O)$—O—$C(R_{36})(R_{37})(R_{38})$, —$C(R_{01})(R_{02})(OR_{39})$ and —$C(R_{01})(R_{02})$—$C(=O)$—O—$C(R_{36})(R_{37})(R_{38})$. Here, —$C(R_{36})(R_{37})(R_{38})$ means a group where the groups represented by $R_{36}$ to $R_{38}$ each is bonded through a single bond. The same applies to the followings.

In the formulae, $R_{36}$ to $R_{39}$ each independently represents an alkyl group, a cycloalkyl group, an aryl group, an aralkyl group or an alkenyl group. Each of the pairs $R_{36}$ and $R_{37}$, and $R_{36}$ and $R_{39}$ may combine to form a ring.

$R_{01}$ and $R_{02}$ each independently represents a hydrogen atom, an alkyl group, a cycloalkyl group, an aryl group, an aralkyl group or an alkenyl group.

The alkyl group of $R_{36}$ to $R_{39}$, $R_{01}$ and $R_{02}$ is preferably an alkyl group having from 1 to 8 carbon atoms and examples thereof include a methyl group, an ethyl group, a propyl group, an n-butyl group, a sec-butyl group, a hexyl group and an octyl group.

The cycloalkyl group of $R_{36}$ to $R_{39}$, $R_{01}$ and $R_{02}$ may be monocyclic type or polycyclic type. The monocyclic type is preferably a cycloalkyl group having from 3 to 8 carbon atoms and examples thereof include a cyclopropyl group, a cyclobutyl group, a cyclopentyl group, a cyclohexyl group and a cyclooctyl group. The polycyclic type is preferably a cycloalkyl group having from 6 to 20 carbon atoms and examples thereof include an adamantyl group, a norbornyl group, an isobornyl group, a camphanyl group, a dicyclopentyl group, an α-pinel group, a tricyclodecanyl group, a tetracyclododecyl group and an androstanyl group. In the cycloalkyl group, a part of carbon atoms may be substituted by a heteroatom such as oxygen atom.

The aryl group of $R_{36}$ to $R_{39}$, $R_{01}$ and $R_{02}$ is preferably an aryl group having from 6 to 10 carbon atoms and examples thereof include a phenyl group, a naphthyl group and an anthryl group.

The aralkyl group of $R_{36}$ to $R_{39}$, $R_{01}$ and $R_{02}$ is preferably an aralkyl group having from 7 to 12 carbon atoms and examples thereof include a benzyl group, a phenethyl group and a naphthylmethyl group.

The alkenyl group of $R_{36}$ to $R_{39}$, $R_{01}$ and $R_{02}$ is preferably an alkenyl group having from 2 to 8 carbon atoms and examples thereof include a vinyl group, an allyl group, a butenyl group and a cyclohexenyl group.

Examples of the substituent which $R_{36}$ to $R_{39}$, $R_{01}$ and $R_{02}$ may have include an alkyl group, a cycloalkyl group, an aryl group, an amino group, an amido group, a ureido group, a urethane group, a hydroxyl group, a carboxyl group, a halogen atom, an alkoxy group, an aryloxy group, a thioether group, an acyl group, an acyloxy group, an alkoxycarbonyl group, a cyano group and a nitro group.

In the acid-decomposable resin (B), the acid-decomposable group decomposes by the action of an acid to generate a hydroxyl group, a carboxyl group or the like, whereby the solubility in an alkaline developer increases.

Preferred examples of the acid-decomposable group represented by $B_1$ and $B_2$ include a silyl ether group, a cumyl ester group, an acetal group, a tetrahydropyranyl ether group, an enol ether group, an enol ester group, a tertiary alkyl ether group, a tertiary alkyl ester group and a tertiary alkyl carbonate group. Among these, more preferred are a tertiary alkyl ester group, a tertiary alkyl carbonate group, a cumyl ester group, an acetal group and a tetrahydropyranyl ether group.

Examples of the group containing a group capable of decomposing by the action of an acid to generate a carboxyl group or a hydroxyl group, represented by $B_1$ and $B_2$, include an alkyl group having, as a substituent, a —$C(=O)$—O— acid-decomposable group or an —O— acid-decomposable group.

Examples of the halogen atom represented by $B_3$ in formula (B2) include a fluorine atom, a chlorine atom, a bromine atom and an iodine atom.

The methyl group represented by $B_3$ may be substituted by a fluorine atom or the like.

Specific examples of the repeating unit represented by formula (B1) are set forth below, but the present invention is not limited thereto.

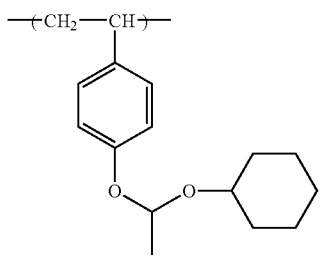
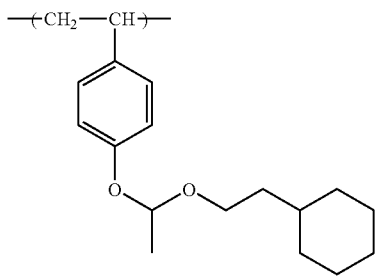
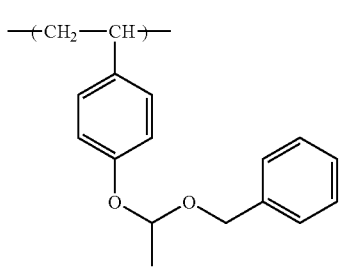
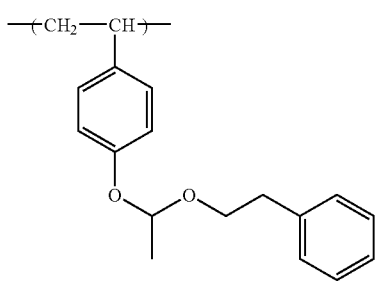
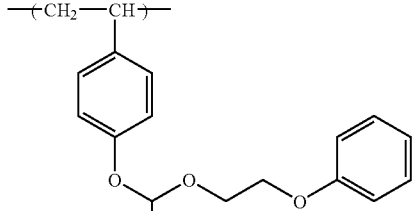
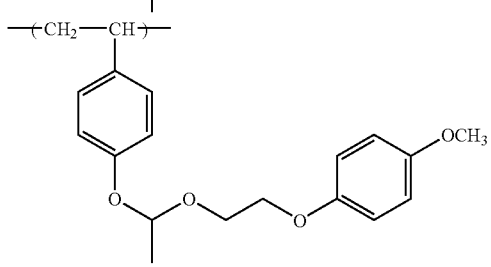
-continued
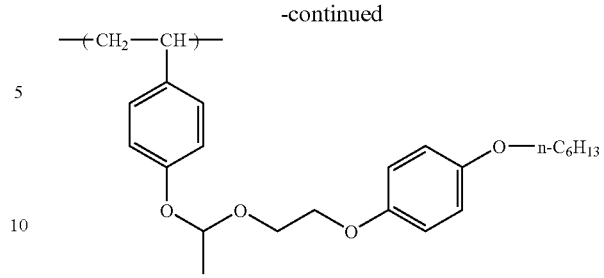
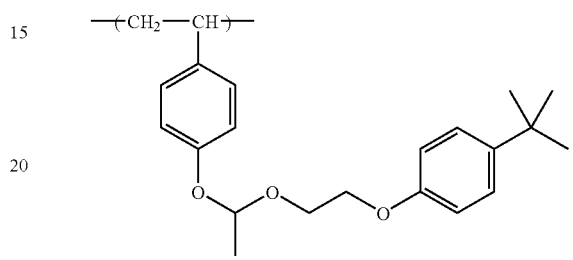
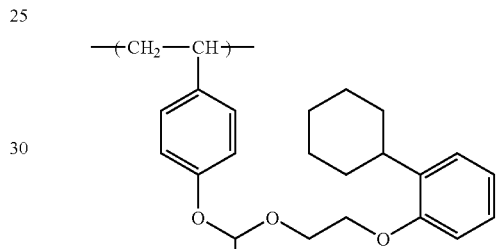
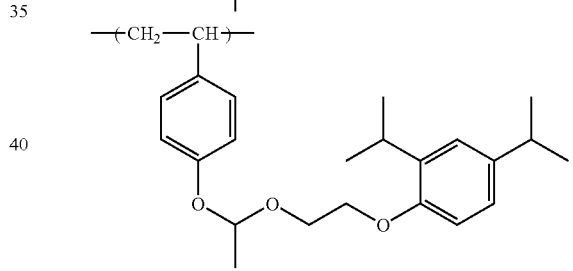
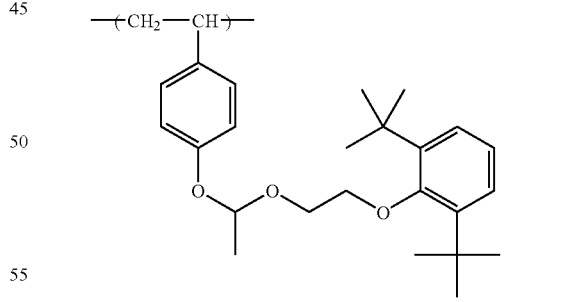
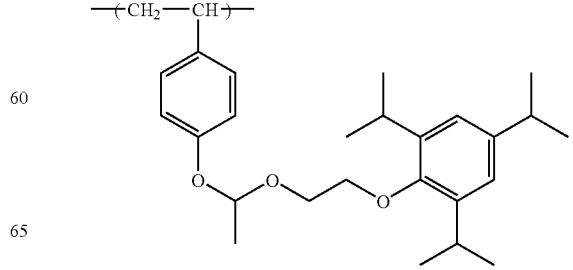

31 32
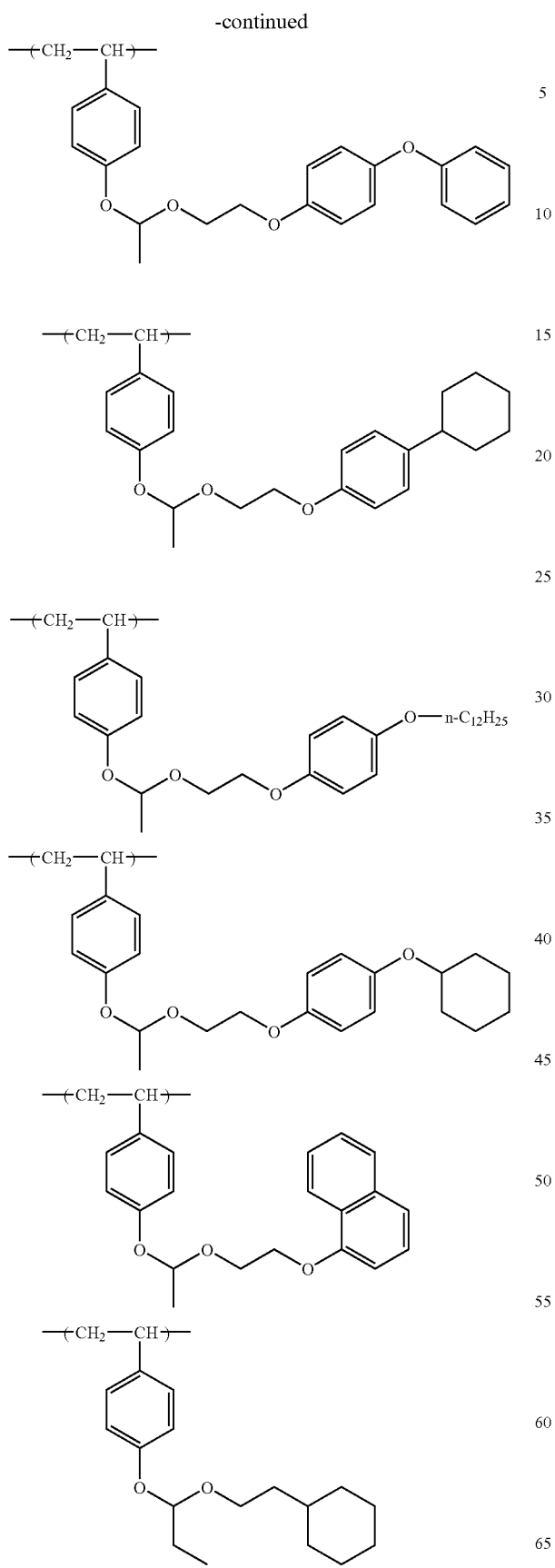
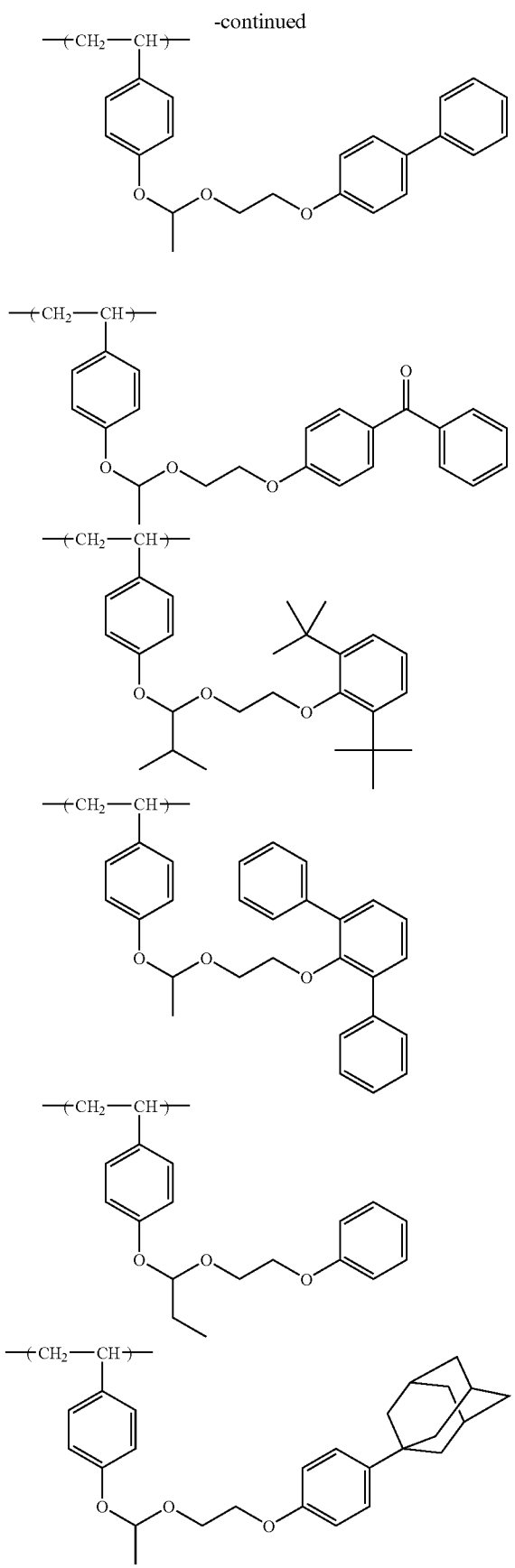

-continued
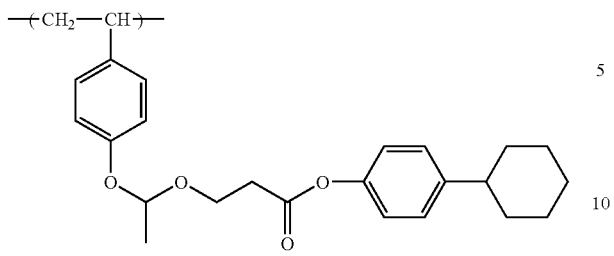
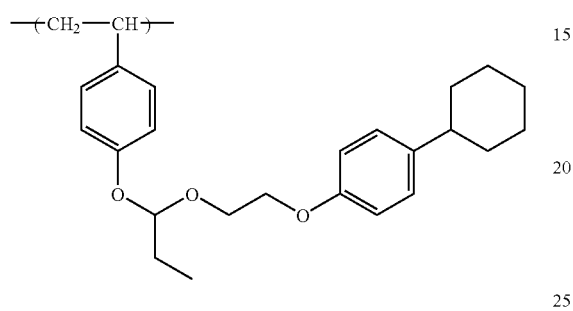
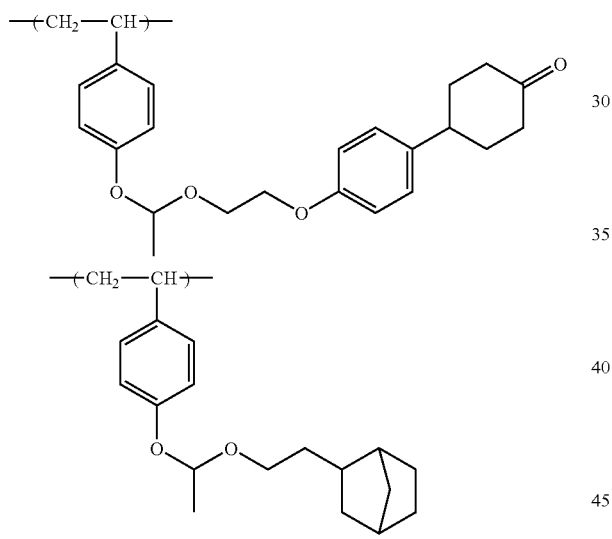
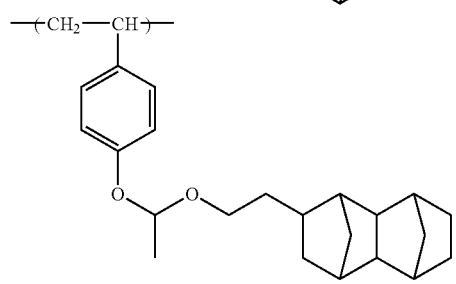
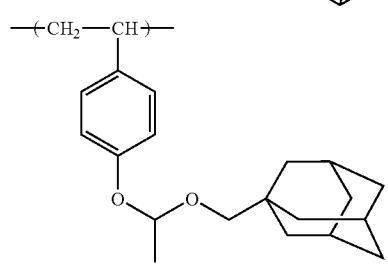
-continued
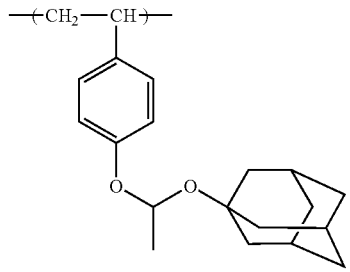
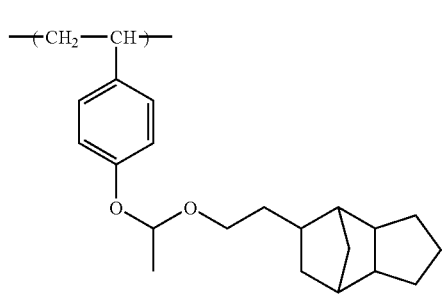
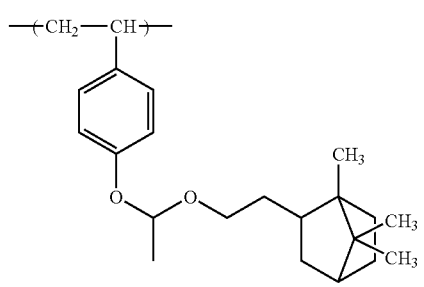
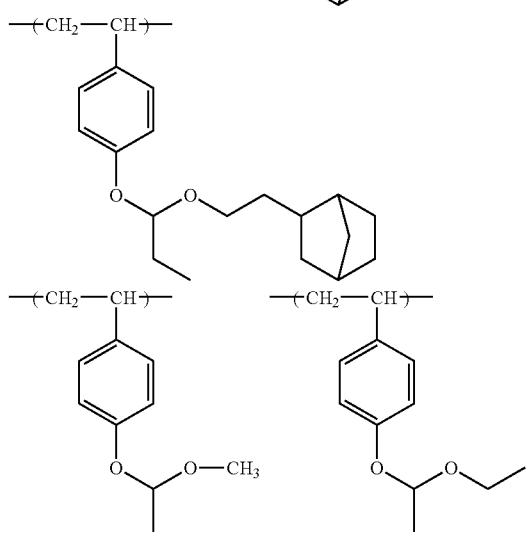

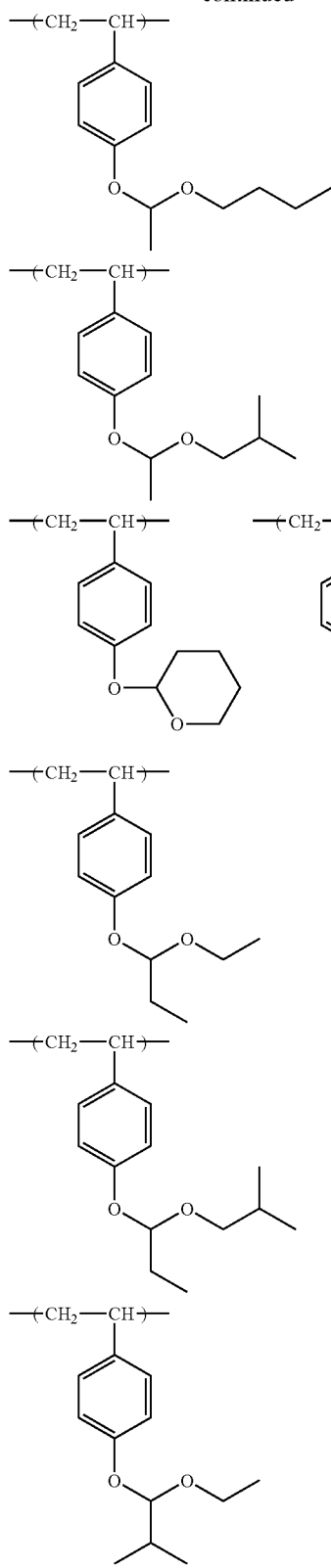
Specific examples of the monomer corresponding to the repeating unit represented by formula (B2) are set forth below, but the present invention is not limited thereto.
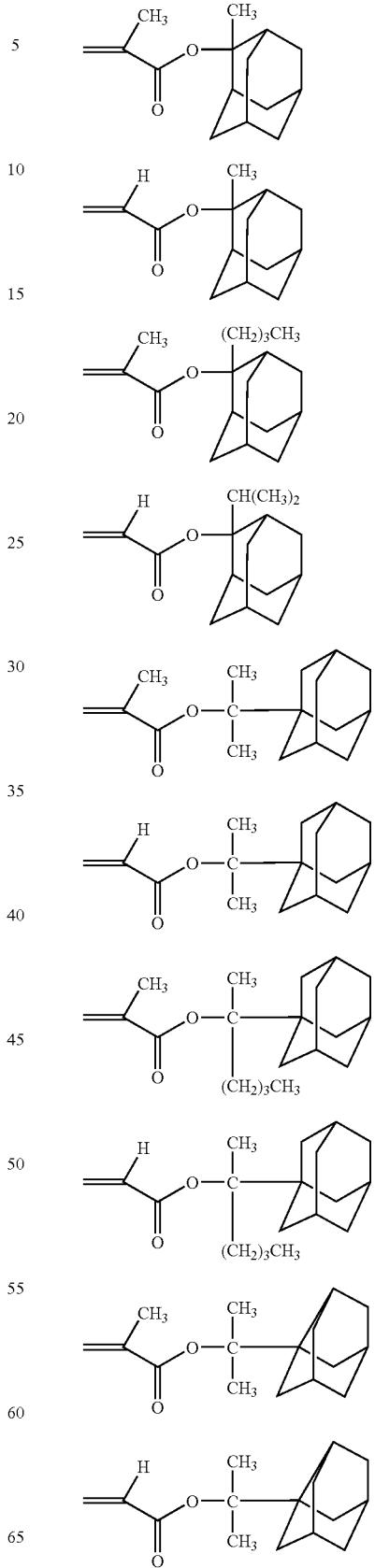

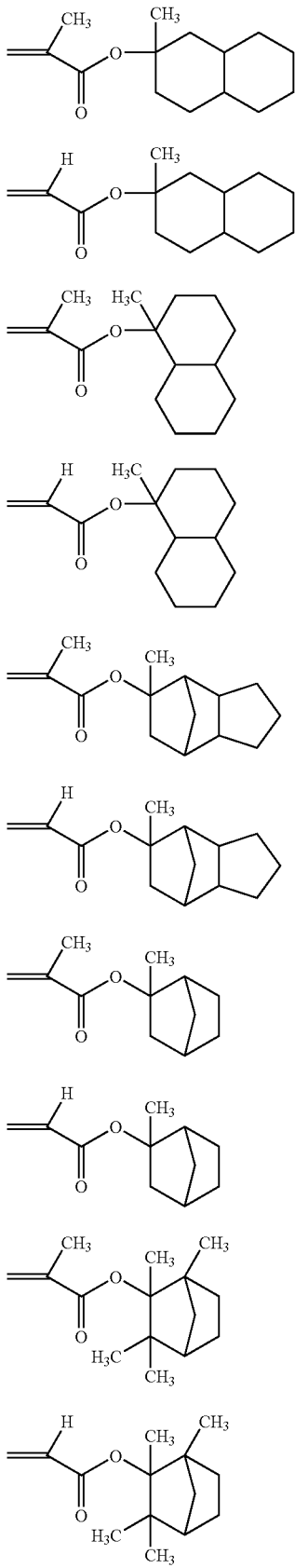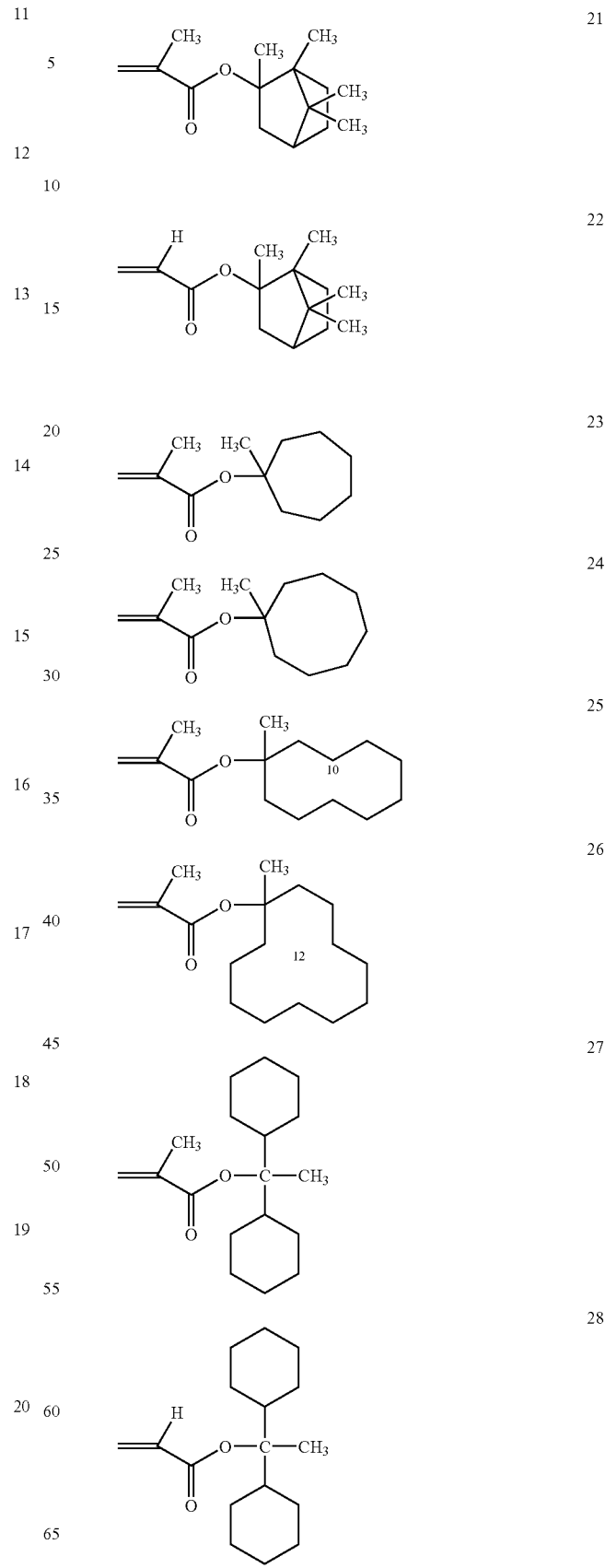

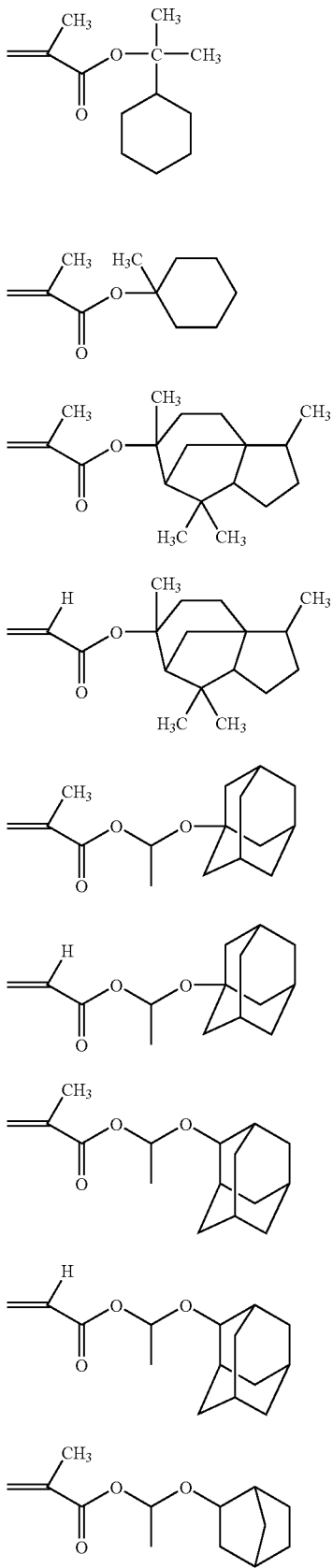

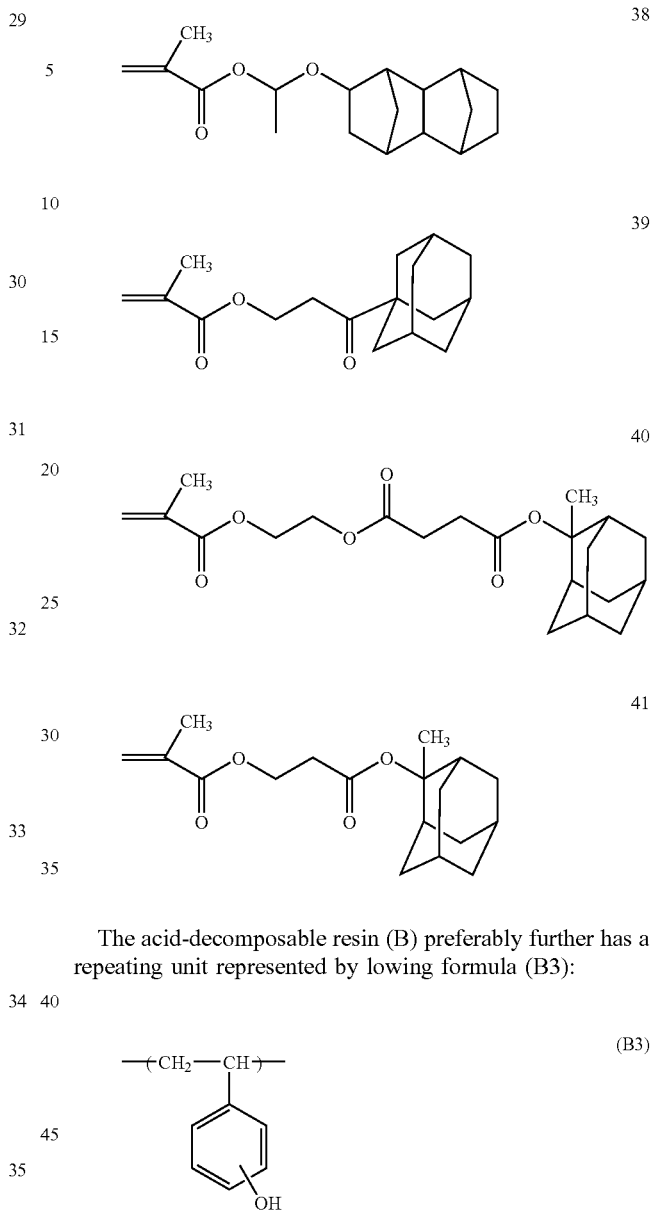

The acid-decomposable resin (B) preferably further has a repeating unit represented by lowing formula (B3):

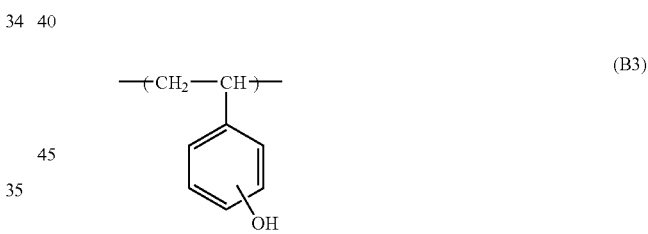

In formula (B3), the benzene ring may further have a substituent such as hydroxyl group, halogen atom, cyano group, nitro group, acyl group and acyloxy group.

Examples of the halogen atom include a fluorine atom, a chlorine atom, a bromine atom and an iodine atom.

The acyl group is preferably an acyl group having from 1 to 8 carbon atoms and examples thereof include a formyl group, an acetyl group, a propanoyl group, a butanoyl group, a pivaloyl group and a benzoyl group.

The acyloxy group is preferably an acyloxy group having from 2 to 8 carbon atoms and examples thereof include an acetoxy group, a propanoyloxy group, an octanoyloxy group and a benzoyloxy group.

Specific examples of the repeating unit represented by formula (B3) are set forth below, but the present invention is not limited thereto.

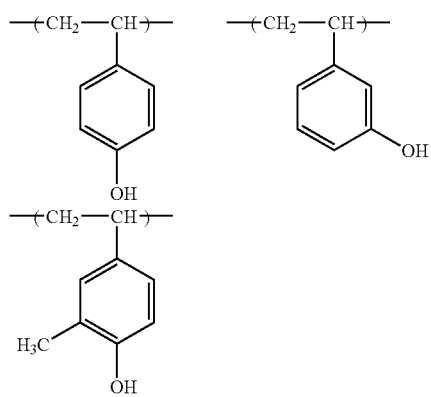
(P1)
The acid-decomposable resin (B) may further have another repeating unit, if desired.
Specific examples of the acid-decomposable resin (B) are set forth below, but the present invention is not limited thereto.
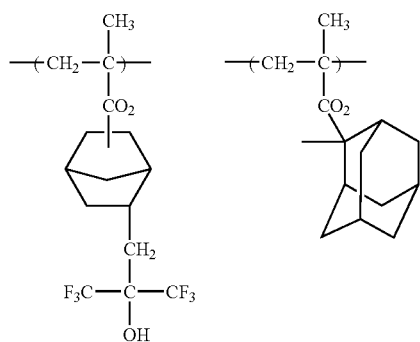
(P2)
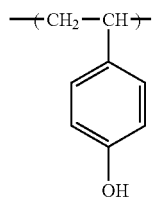
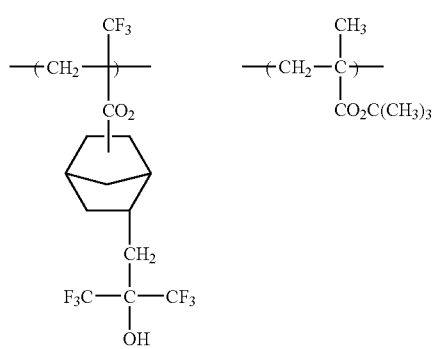
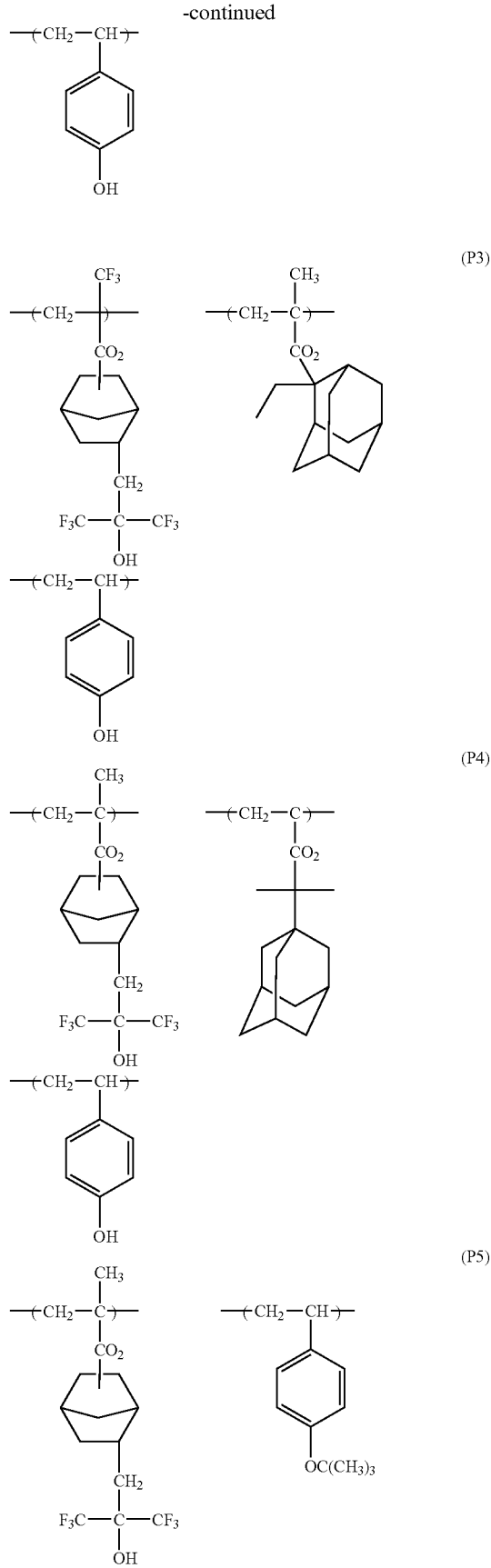

-continued
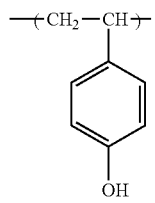
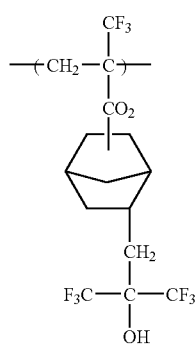 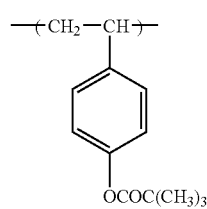   (P6)
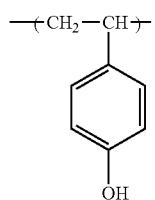
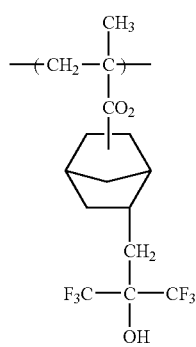 (P7)
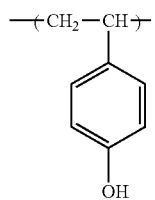
-continued
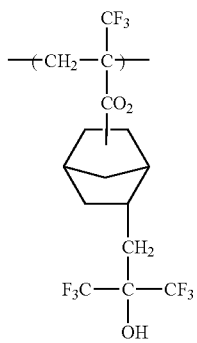 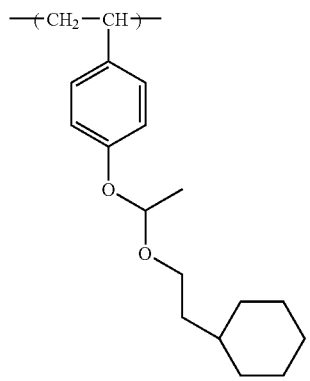   (P8)
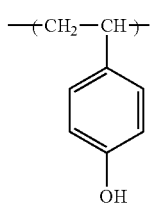
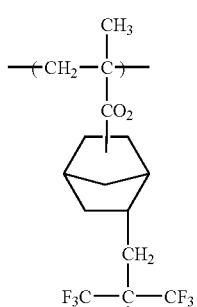 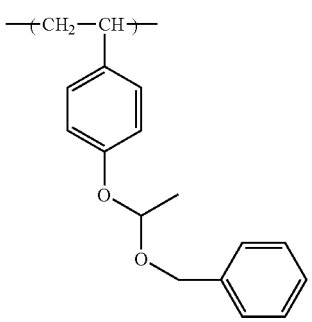   (P9)
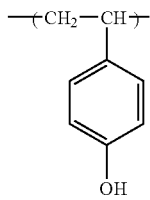
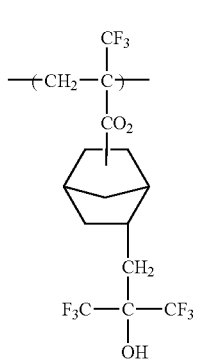 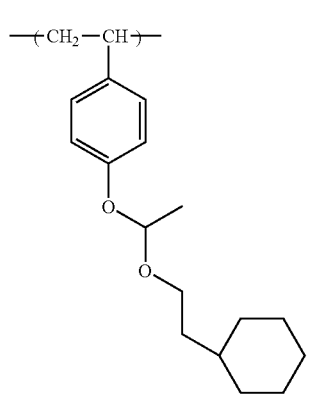   (P10)

-continued
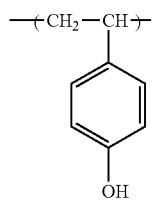
(P11)
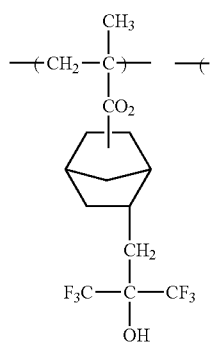 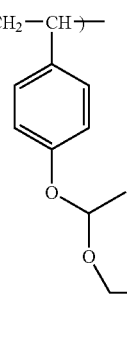
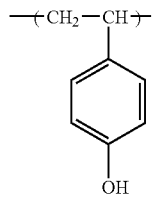
(P12)
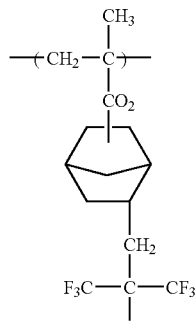
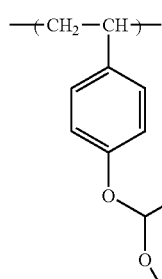
-continued
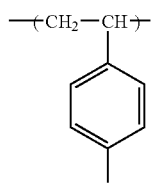
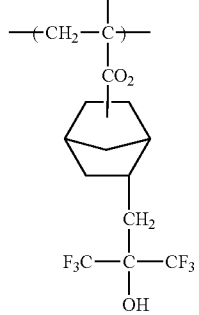
(P13)
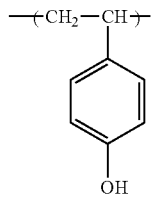
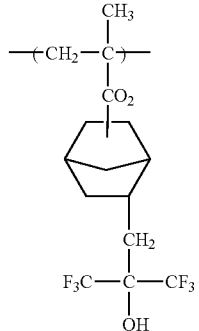
(P14)
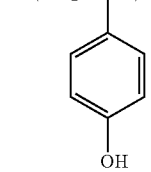
(P15)
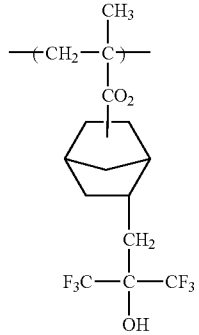

-continued
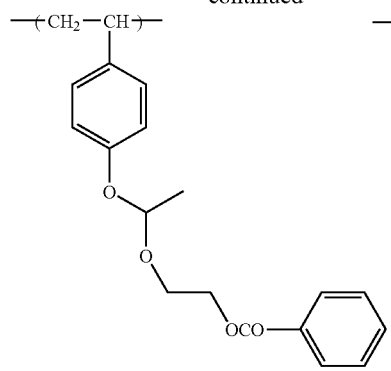
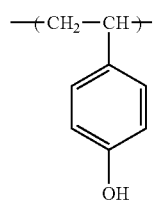
(P16)
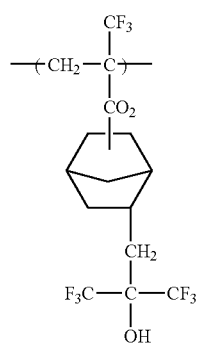
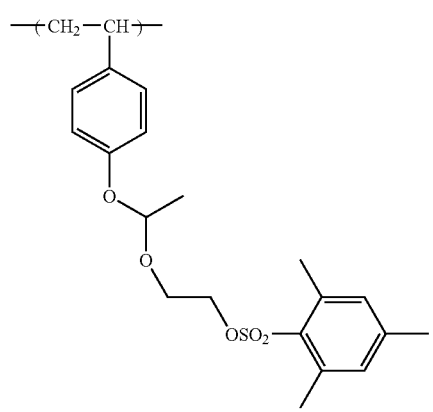
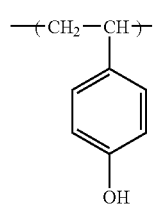
-continued
(P17)
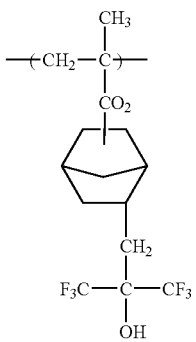
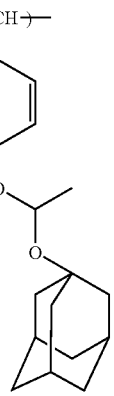
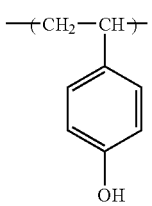
(P18)
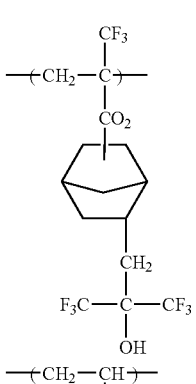
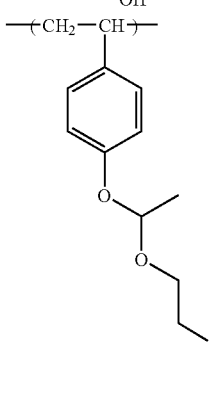
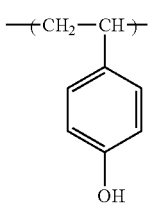

(P19) 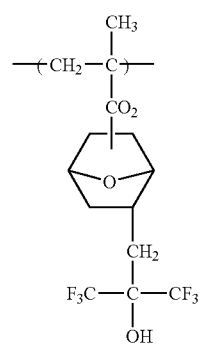 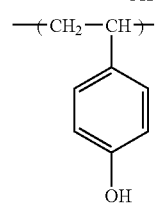
(P20) 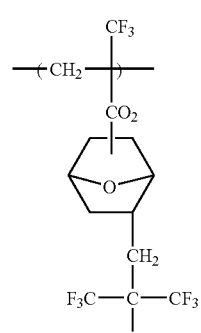 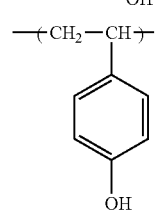
(P21) 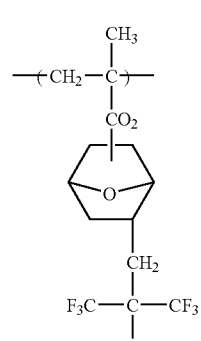 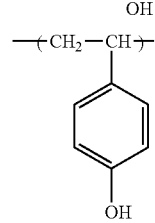
(P22) 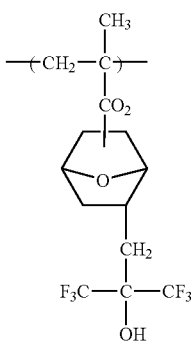 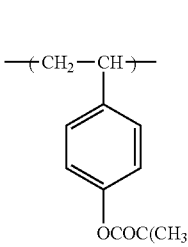
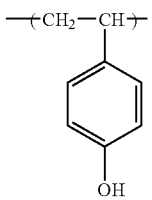
(P23) 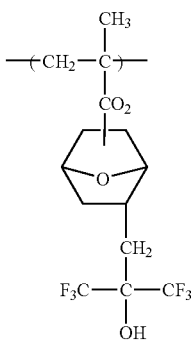
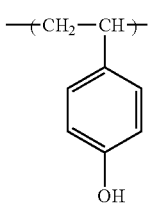
(P24) 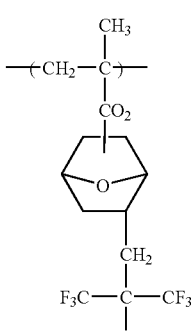

-continued

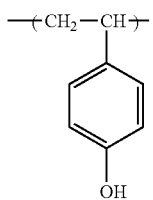

In the acid-decomposable resin (B), the content of the repeating unit having an alicyclic group connected with a fluorine-substituted alcohol residue is preferably from 10 to 40 mol %, more preferably from 15 to 35 mol %.

In the acid-decomposable resin (B), the content of the repeating unit represented by formula (B1) and/or repeating unit represented by formula (B2) is preferably from 10 to 50 mol %, more preferably from 15 to 40 mol %.

In the acid-decomposable resin (B), the content of the repeating unit represented by formula (B3) is preferably from 20 to 60 mol %, more preferably from 30 to 45 mol %.

The acid-decomposable resin (B) can be synthesized by a known synthesis method such as a method of reacting an alkali-soluble resin with a precursor of a group capable of decomposing by the action of an acid, described in European Patent 254,853, JP-A-2-258500, JP-A-3-223860 and JP-A-251259, or a method of copolymerizing a monomer capable of decomposing by the action of an acid with various monomers.

The weight average molecular weight (Mw) of the acid-decomposable resin (B) is preferably from 1,000 to 200,000, more preferably from 1,500 to 100,000, still more preferably from 2,000 to 50,000. When the weight average molecular weight is from 1,000 to 200,000, the unexposed area can be prevented from film loss and at the same time, the dissolution rate of the resin itself in an alkali can be increased, thereby enhancing the sensitivity.

The molecular weight distribution (Mw/Mn) is preferably from 1.0 to 4.0, more preferably from 1.0 to 3.0, still more preferably from 1.0 to 2.5.

The weight average molecular weight as used herein is defined by the value in terms of polystyrene according to gel permeation chromatography.

The amount of the resin-decomposable resin (B) added is suitably from 50 to 98% by weight, preferably from 60 to 97% by weight, more preferably from 65 to 96% by weight, based on the solid content of the positive resist composition.

For the acid-decomposable resin (B), one resin may be used alone or a mixture of two or more resins may be used.

[3] (C1) Compound having a molecular weight of 1,500 or more, of which solubility in an alkaline developer increases by the action of an acid, (C2) polyhydric phenol compound having a molecular weight of 1,000 or less and being soluble in an alkaline developer, and (C3) compound having a molecular weight of 2,000 or less and containing —(OCH$_2$CH(R$_1$))$_{n1}$OR$_2$ group (wherein R$_1$ represents a hydrogen atom or a methyl group, R$_2$ represents a hydrogen atom or a monovalent organic group, and n1 represents an integer of 1 to 10).

The positive resist composition of the present invention may further contain at least one compound selected from (C1) a compound having a molecular weight of 1,500 or less, of which solubility in an alkaline developer increases by the action of an acid (hereinafter, sometimes referred to as a "component (C1)"), (C2) a polyhydric phenol compound having a molecular weight of 1,000 or less and being soluble in an alkaline developer (hereinafter, sometimes referred to as a "component (C2)") and (C3) a compound having a molecular weight of 2,000 or less and containing —(OCH$_2$CH(R$_1$))$_{n1}$OR$_2$ group (wherein R$_1$ represents a hydrogen atom or a methyl group, R$_2$ represents a hydrogen atom or a monovalent organic group, and n1 represents an integer of 1 to 10) (hereinafter, sometimes referred to as a "component (C3)"). The components (C1) to (C3) are sometimes collectively called a component (C).

Component (C1):

The component (C1) is described below.

The component (C1) blended in the composition of the present invention is preferably a compound having in its structure at least two groups capable of decomposing by the action of an acid, where acid-decomposable groups at remotest positions are separated via at least 8 bonding atoms exclusive of the acid-decomposable groups.

The component (C1) is more preferably a compound having in its structure at least two groups capable of decomposing by the action of an acid, where acid-decomposable groups at remotest positions are separated via at least 10, preferably at least 11, more preferably at least 12, bonding atoms exclusive of the acid-decomposable groups, or a compound having at least three acid-decomposable groups, where acid-decomposable groups at remotest positions are separated via at least 9, preferably at least 10, more preferably at least 11, bonding atoms exclusive of the acid-decomposable groups. The upper limit of the number of bonding atoms is preferably 50, more preferably 30.

In the case where the acid-decomposable dissolution-inhibiting compound as the component (C1) has three or more, preferably four or more, acid-decomposable groups, or even in the case of having two acid-decomposable group, the dissolution-inhibiting property for the acid-decomposable resin (A) is remarkably enhanced when the acid-decomposable groups are separated at a certain distance or more.

The distance between acid-decomposable groups is expressed by the number of bonding atoms intervening therebetween, exclusive of the acid-decomposing groups. For example, in each of the following compounds (1) and (2), the distance between acid-decomposable groups is 4 bonding atoms, and in the compound (3), the distance is 12 bonding atoms.

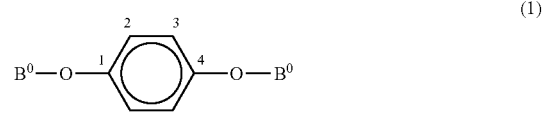

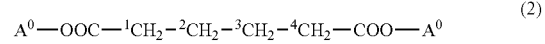

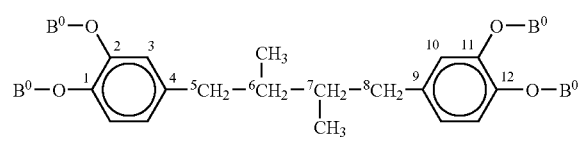

acid-decomposable group: —COO-A$^0$, —O—B$^0$

The acid-decomposable dissolution-inhibiting compound as the component (C1) may have a plurality of acid-decomposable groups on one benzene ring, but this is preferably a compound constituted by a skeleton having one acid-decomposable group on one benzene ring. The molecular weight of the acid-decomposable dissolution-inhibiting compound for use in the present invention is 1,500 or less, preferably from 300 to 1,500, more preferably from 500 to 1,500.

In a preferred embodiment of the present invention, the group capable of decomposing by the action of an acid, namely, the group containing —COO-$A^0$ group or —O—$B^0$ group, is a group represented by —$R^0$—COO-$A^0$ or —Ar—O—$B^0$.

In the formulae above, $A^0$ represents —$C(R^{01})(R^{02})(R^{03})$ group, —$Si(R^{01})(R^{02})(R^{03})$ group or —$C(R^{04})(R^{05})$—O—$R^{06}$ group, and $B^0$ represents $A^0$ group or —CO—O-$A^0$ group.

$R^{01}$, $R_{02}$, $R_{03}$, $R^{04}$ and $R^{05}$, which may be the same or different, each represents a hydrogen atom, an alkyl group, a cycloalkyl group, an alkenyl group or an aryl group, and $R^{06}$ represents an alkyl group or an aryl group. However, at least two of $R^{01}$ to $R^{03}$ are a group other than a hydrogen atom. Also, two groups out of $R^{01}$ to $R^{03}$ may combine to form a ring, and two groups out of $R^{04}$ to $R^{06}$ may combine to form a ring. $R^0$ represents a divalent or greater valent aliphatic or aromatic hydrocarbon group which may be substituted, and —Ar— represents a monocyclic or polycyclic divalent or greater valent aromatic group which may be substituted.

The alkyl group is preferably an alkyl group having from 1 to 4 carbon atoms (e.g., methyl, ethyl, propyl, n-butyl, sec-butyl, tert-butyl), the cycloalkyl group is preferably a cycloalkyl group having from 3 to 10 carbon atoms (e.g., cyclopropyl, cyclobutyl, cyclohexyl, adamantyl), the alkenyl group is preferably an alkenyl group having from 2 to 4 carbon atoms (e.g., vinyl, propenyl, allyl, butenyl group), and the aryl group is preferably an aryl group having from 6 to 14 carbon atoms (e.g., phenyl, xylyl, toluyl, cumenyl, naphthyl, anthracenyl).

Examples of the substituent include a hydroxyl group, a halogen atom (e.g., fluorine, chlorine, bromine, iodine), a nitro group, a cyano group, the above-described alkyl group, an alkoxy group (e.g., methoxy, ethoxy, hydroxyethoxy, propoxy, hydroxypropoxy, n-butoxy, isobutoxy, sec-butoxy, tert-butoxy), an alkoxycarbonyl group (e.g., methoxycarbonyl, ethoxycarbonyl), an aralkyl group (e.g., benzyl, phenethyl, cumyl), an aralkyloxy group, an acyl group (e.g., formyl, acetyl, butyryl, benzoyl, cyanamyl, valeryl), an acyloxy group (e.g., butyryloxy), the above-described alkenyl group, an alkenyloxy group (e.g., vinyloxy, propenyloxy, allyloxy, butenyloxy), the above-described aryl group, an aryloxy group (e.g., phenoxy), and an aryloxycarbonyl group (e.g., benzoyloxy).

Preferred examples of the acid-decomposable group include a silyl ether group, a cumyl ester group, an acetal group, a tetrahydropyranyl ether group, an enol ether group, an enol ester group, a tertiary alkyl ether group, a tertiary alkyl ester group, and a tertiary alkyl carbonate group, and the groups same as —$B_1$ group in formula (B1). Among these, more preferred are a tertiary alkyl ester group, a tertiary alkyl carbonate group, a cumyl ester group, a tetrahydropyranyl ether group and —$C(R_{36})(R_{37})(OR_{39})$ described above as a specific example of —$B_1$ group.

Preferred examples of the component (C1) include compounds where a part or all of the phenolic OH groups in the polyhydroxy compound described in JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, and Japanese Patent Application Nos. 3-33229, 3-230790, 3-320438, 4-25157, 4-52732, 4-103215, 4-104542, 4-107885, 4-107889 and 4-152195 are bonded and protected by the above-described group, —$R^0$—COO—$A^0$ group or $B^0$ group.

Among these, more preferred are compounds using the polyhydroxy compound described in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, and Japanese Patent Application Nos. 4-25157, 4-103215, 4-104542, 4-107885, 4-107889 and 4-152195.

More specifically, examples thereof include the compounds represented by formulae [I] to [XVI].

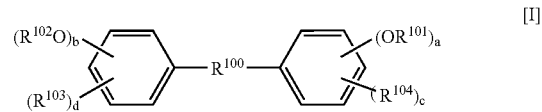

[I]

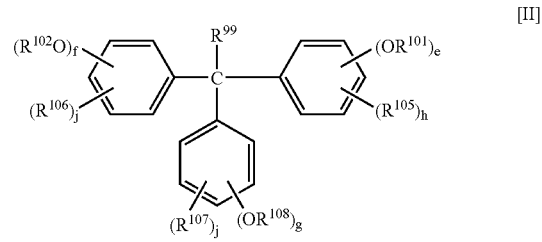

[II]

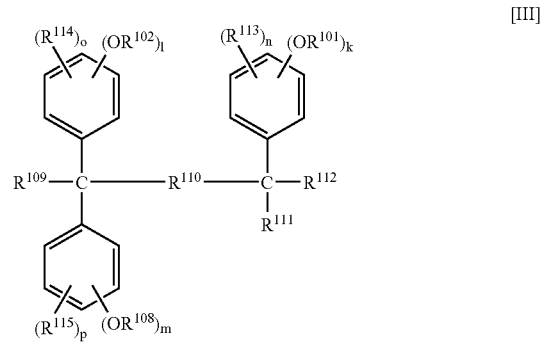

[III]

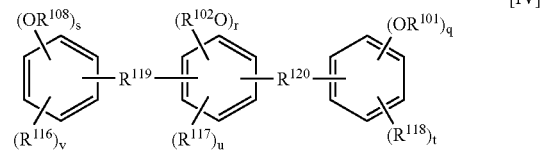

[IV]

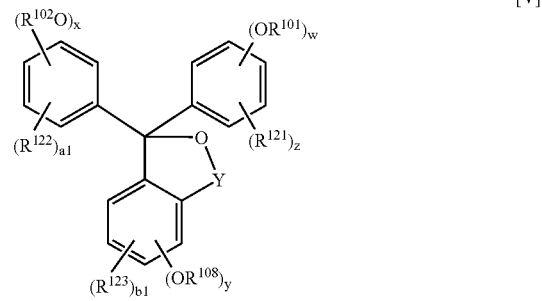

[V]

-continued

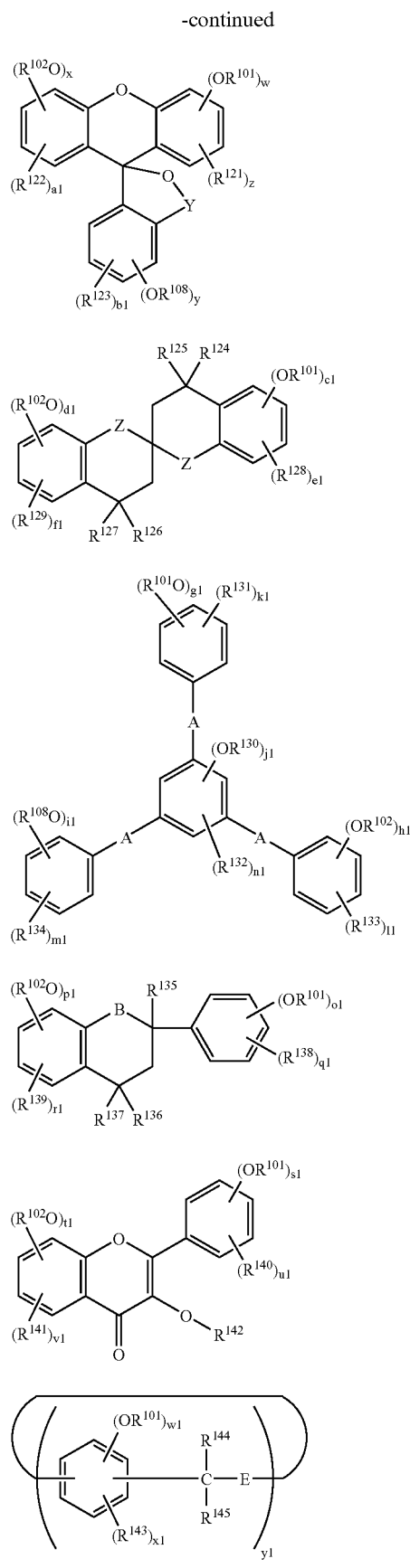

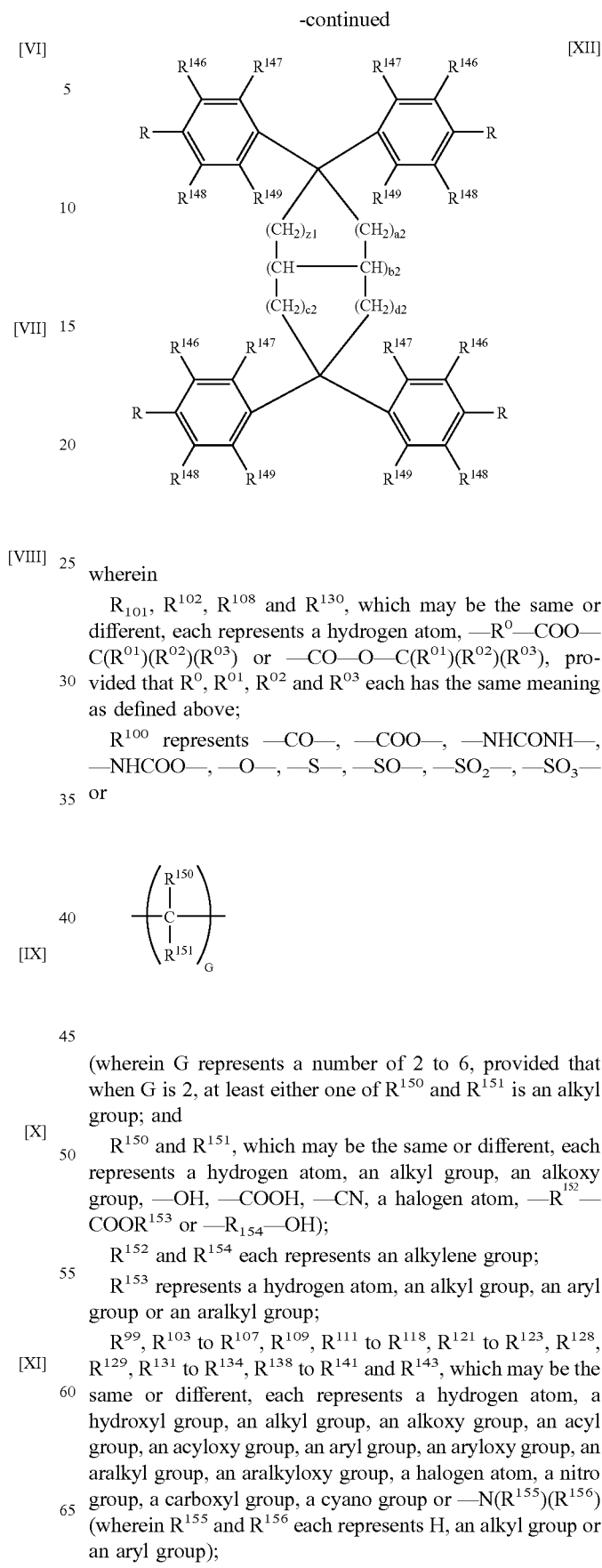

wherein $R_{101}$, $R^{102}$, $R^{108}$ and $R^{130}$, which may be the same or different, each represents a hydrogen atom, —$R^0$—COO—C($R^{01}$)($R^{02}$)($R^{03}$) or —CO—O—C($R^{01}$)($R^{02}$)($R^{03}$), provided that $R^0$, $R^{01}$, $R^{02}$ and $R^{03}$ each has the same meaning as defined above;

$R^{100}$ represents —CO—, —COO—, —NHCONH—, —NHCOO—, —O—, —S—, —SO—, —SO$_2$—, —SO$_3$— or (wherein G represents a number of 2 to 6, provided that when G is 2, at least either one of $R^{150}$ and $R^{151}$ is an alkyl group; and $R^{150}$ and $R^{151}$, which may be the same or different, each represents a hydrogen atom, an alkyl group, an alkoxy group, —OH, —COOH, —CN, a halogen atom, —$R^{152}$—COO$R^{153}$ or —$R_{154}$—OH);

$R^{152}$ and $R^{154}$ each represents an alkylene group;

$R^{153}$ represents a hydrogen atom, an alkyl group, an aryl group or an aralkyl group;

$R^{99}$, $R^{103}$ to $R^{107}$, $R^{109}$, $R^{111}$ to $R^{118}$, $R^{121}$ to $R^{123}$, $R^{128}$, $R^{129}$, $R^{131}$ to $R^{134}$, $R^{138}$ to $R^{141}$ and $R^{143}$, which may be the same or different, each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group or —N($R^{155}$)($R^{156}$) (wherein $R^{155}$ and $R^{156}$ each represents H, an alkyl group or an aryl group);

$R^{110}$ represents a single bond, an alkylene group or

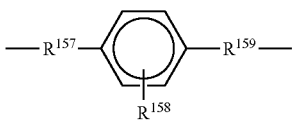

(wherein $R^{157}$ and $R^{159}$, which may be the same or different, each represents a single bond, an alkylene group, —O—, —S—, —CO— or a carboxyl group; and $R^{158}$ represents a hydrogen atom, an alkyl group, an alkoxy group, an acyl group, an acyloxy group, an aryl group, a nitro group, a hydroxyl group, a cyano group or a carboxyl group, provided that the hydroxyl group may be displaced by an acid-decomposing group (e.g., tert-butoxycarbonylmethyl, tetrahydropyranyl, 1-ethoxy-1-ethyl, 1-tert-butoxy-1-ethyl));

$R^{119}$ and $R^{120}$, which may be the same or different, each represents a methylene group, a lower alkyl-substituted methylene group, a halomethylene group or a haloalkyl group, provided that the lower alkyl group as used in the present invention means an alkyl group having from 1 to 4 carbon atoms;

$R^{124}$ to $R^{127}$, which may be the same or different, each represents a hydrogen atom or an alkyl group;

$R^{135}$ to $R^{137}$, which may be the same or different, each represents a hydrogen atom, an alkyl group, an alkoxy group, an acyl group or an acyloxy group;

$R^{142}$ represents a hydrogen atom, —R$^O$—COO—C($R^{01}$)($R^{02}$)($R^{03}$), —CO—O—C($R^{01}$)($R^{02}$)($R^{03}$) or

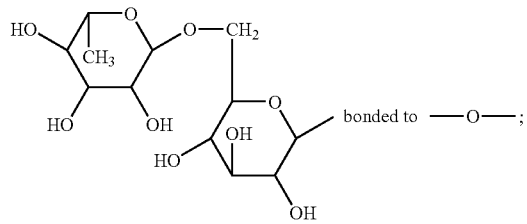

$R^{144}$ and $R^{145}$, which may be the same or different, each represents a hydrogen atom, a lower alkyl group, a lower haloalkyl group or an aryl group;

$R^{146}$ to $R^{149}$, which may be the same or different, each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group or an aryloxycarbonyl group, provided that four substituents under the same symbol may not be the same group;

Y represents —CO— or —SO$_2$—;

Z and B each represents a single bond or —O—;

A represents a methylene group, a lower alkyl-substituted methylene group, a halomethylene group or a haloalkyl group;

E represents a single bond or an oxymethylene group;

when a to z and a1 to y1 each is a plural number, the group in the parenthesis may be the same or different;

a to q, s, t, v, g1 to i1, k1 to m1, o1, q1, s1 and u1 each represents 0 or an integer of 1 to 5;

r, u, w, x, y, z, a1 to f1, p1, r1, t1 and v1 to x1 each represents 0 or an integer of 1 to 4;

j1, n1, z1, a2, b2, c2 and d2 each represents 0 or an integer of 1 to 3;

at least one of z1, a2, c2 and d2 represents an integer of 1 or more;

y1 represents an integer of 3 to 8;

(a+b), (e+f+g), (k+l+m), (q+r+s), (w+x+y), (c1+d1), (g1+h1+i1+j1), (o1+p1), (s1+t1)$\geq$2;

(j1+n1)$\leq$3;

(r+u), (w+z), (x+a1), (y+b1), (c1+e1), (d1+f1), (p1+r1), (t1+v1), (x1+w1)$\leq$4, provided that in the case of formula (V), (w+z), (x+a1)$\leq$5; and (a+c), (b+d), (e+h), (f+i), (g+j), (k+n), (l+o), (m+p), (q+t), (s+v), (g1+k1), (h1+l1), (i1+m1), (o1+q1), (s1+u1)$\leq$5;

(XIII)

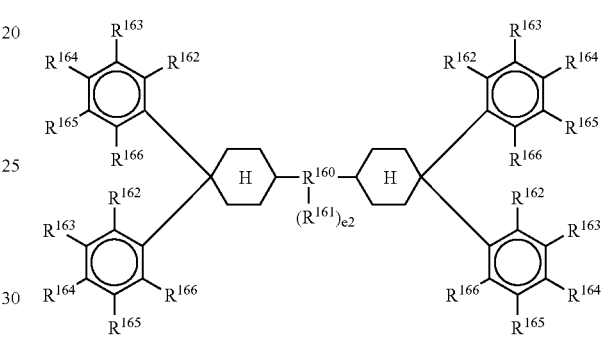

wherein $R^{160}$ represents an organic group, a single bond,

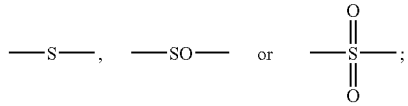

$R_{161}$ represents a hydrogen atom, a monovalent organic group or

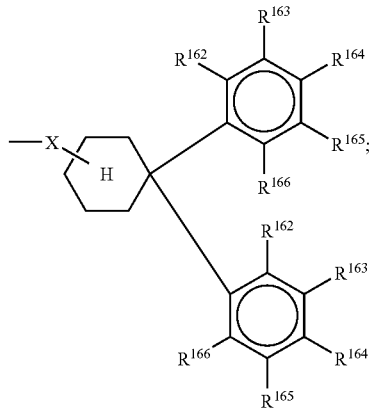

$R^{162}$ to $R^{166}$, which may be the same or different, each represents a hydrogen atom, a hydroxyl group, a halogen atom, an alkyl group, an alkoxy group, an alkenyl group, —O—$R^O$—COO—C($R^{01}$)($R^{02}$)($R^{03}$) or —O—CO—O—C($R^{01}$)($R^{02}$)($R^{03}$), provided that at least two of $R^{162}$ to $R^{166}$ is —O—R$^0$—COO—C(R$^{01}$)(R$^{02}$)(R$^{03}$) or —O—CO—O—C(R$^{01}$)(R$^{02}$)(R$^{03}$) and that four or six substituents under the same symbol may not be the same group;

X represents a divalent organic group; and e2 represents 0 or 1;

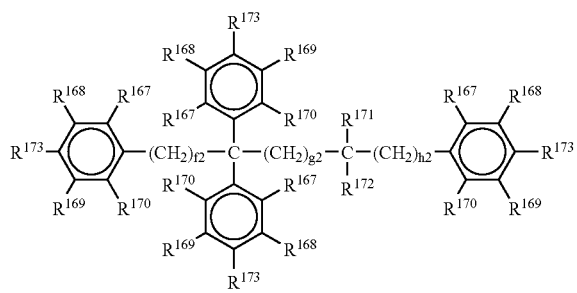

(XIV)

wherein R$^{167}$ to R$^{170}$, which may be the same or different, each represents a hydrogen atom, a hydroxyl group, a halogen atom, an alkyl group, an alkoxy group or an alkenyl group, provided that four, five or six substituents under the same symbol may not be the same group;

R$^{171}$ and R$^{172}$ each represents a hydrogen atom, an alkyl group or

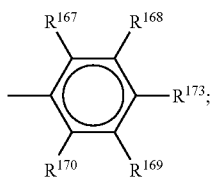

at least two R$^{173}$s represent —O—R$^0$—COO—C(R$^{01}$)(R$^{02}$)(R$^{03}$) group or —O—CO—O—C(R$^{01}$)(R$^{02}$)(R$^{03}$) group and others represent a hydroxyl group;

f2 and h2 each represents 0 or 1; and g2 represents 0 or an integer of 1 to 4;

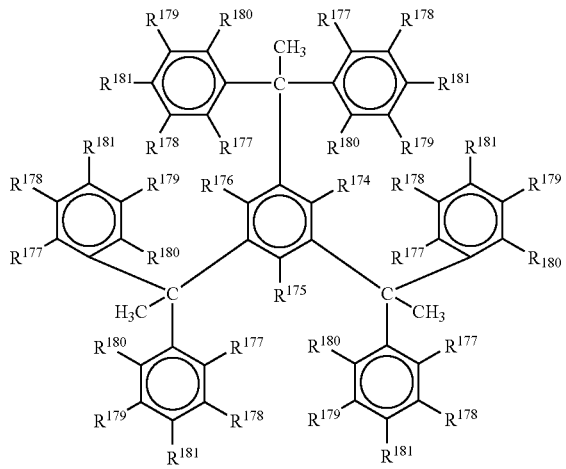

(XV)

wherein R$^{174}$ to R$^{180}$, which may be the same or different, each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group or an aryloxy group, provided that six substituents under the same symbol may not be the same group; and at least two R$^{181}$s represent —O—R$_0$—COO—C(R$^{01}$)(R$^{02}$)(R$^{03}$) group or —O—CO—O—C(R$^{01}$)(R$^{02}$)(R$^{03}$) group and others represent a hydroxyl group; and

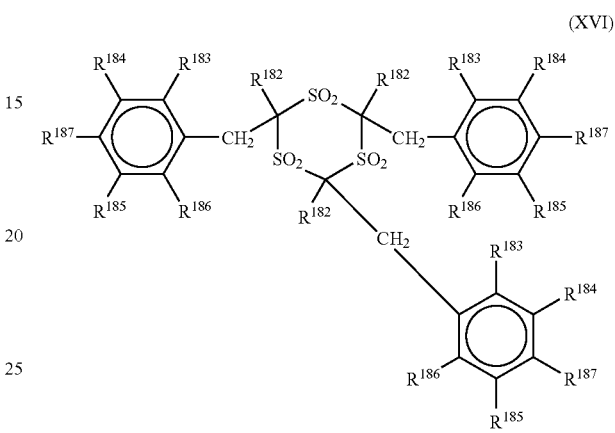

(XVI)

wherein R$^{182}$ represents a hydrogen atom or an alkyl group, provided that all R$^{182}$s may not be the same;

R$^{183}$ to R$^{186}$ each represents a hydroxyl group, a hydrogen atom, a halogen atom, an alkyl group or an alkoxy group, provided that three substituents under the same symbol may not be the same group; and at least two R$^{187}$s represent —O—R$^0$—COO—C(R$^{01}$)(R$^{02}$)(R$^{03}$) group or —O—CO—O—C(R$^{01}$)(R$^{02}$)(R$^{03}$) group and the other represents a hydroxyl group.

Specific examples of preferred compound skeletons are set forth below.

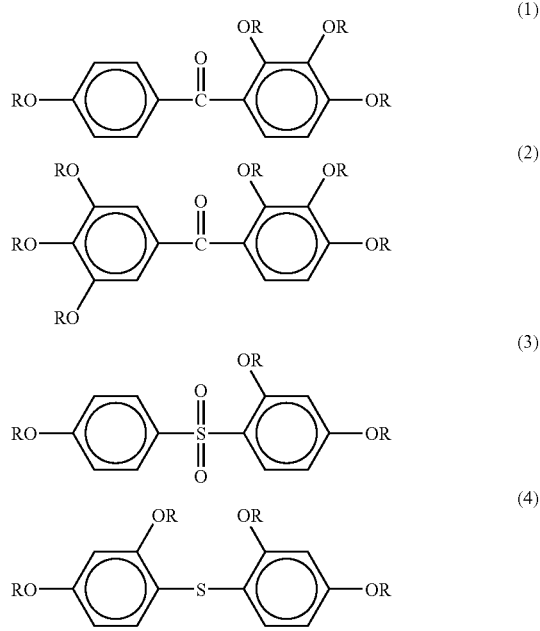

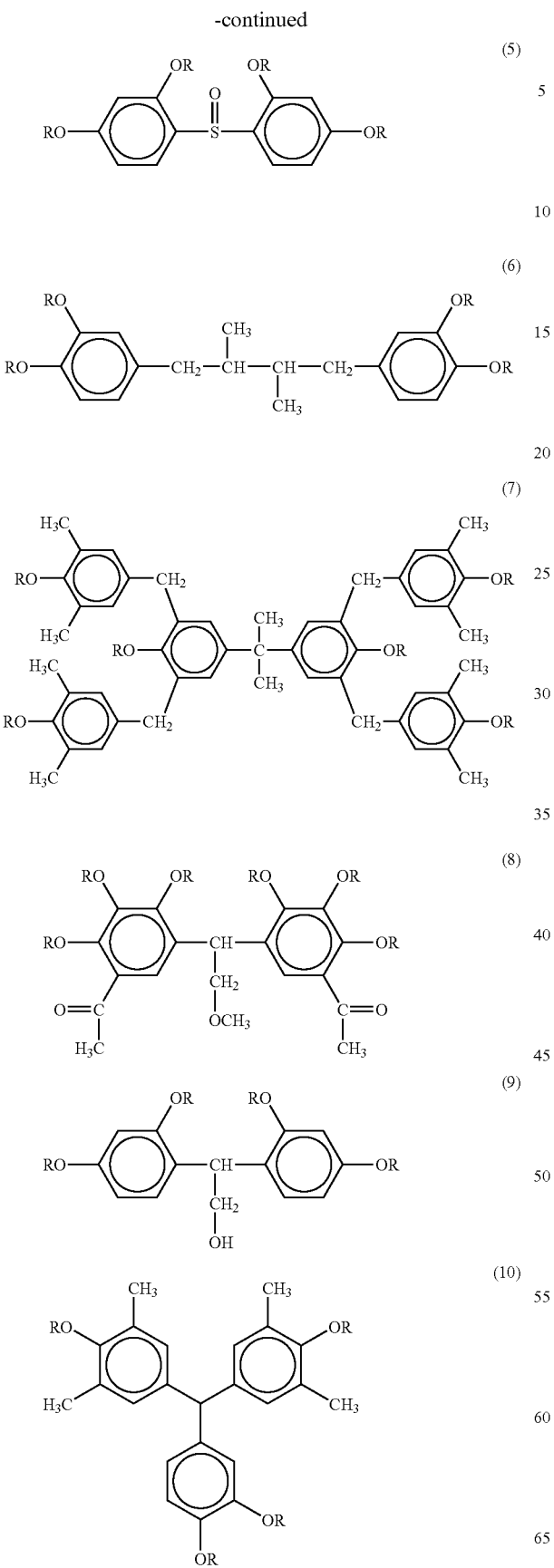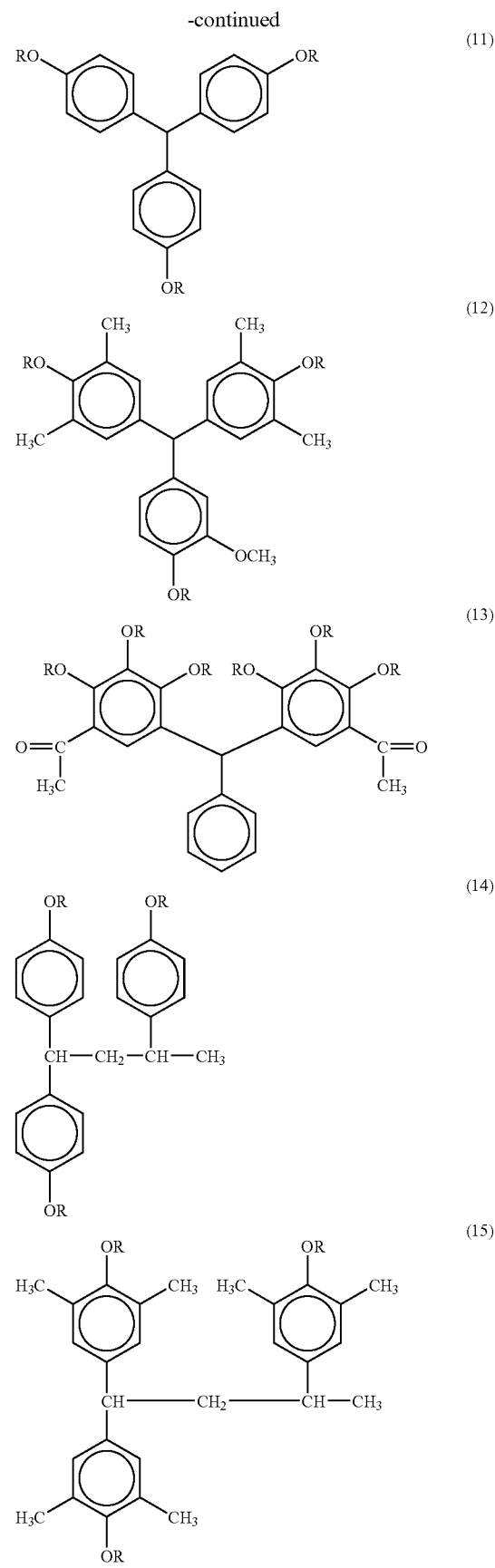

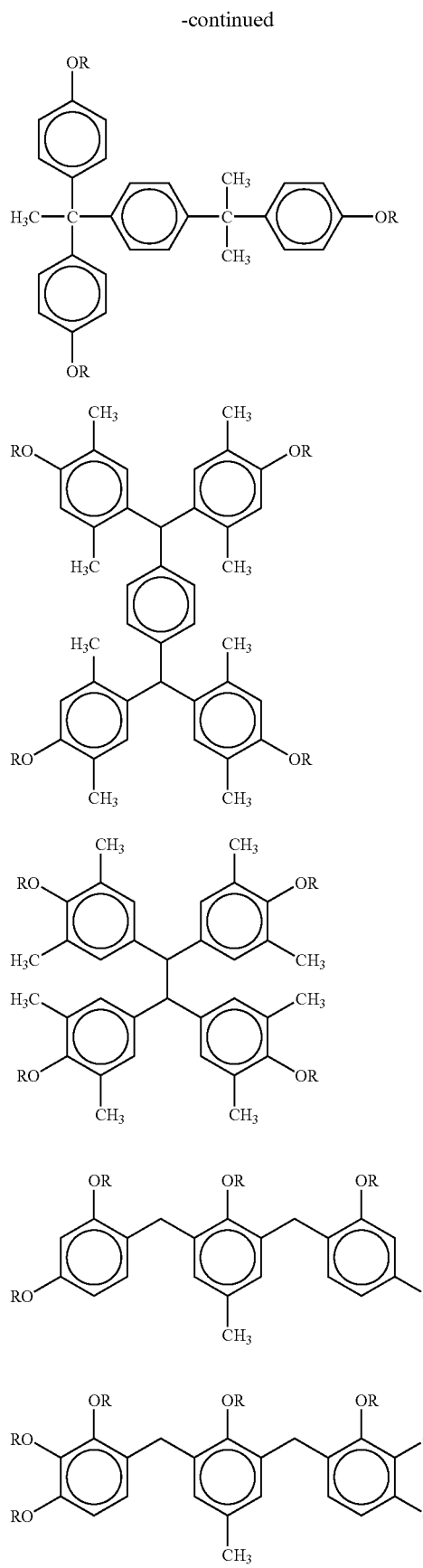
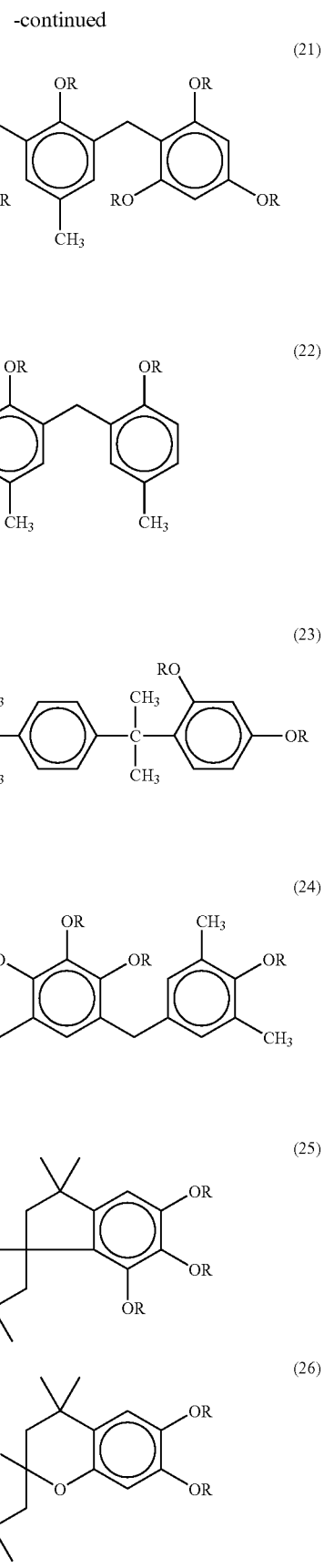

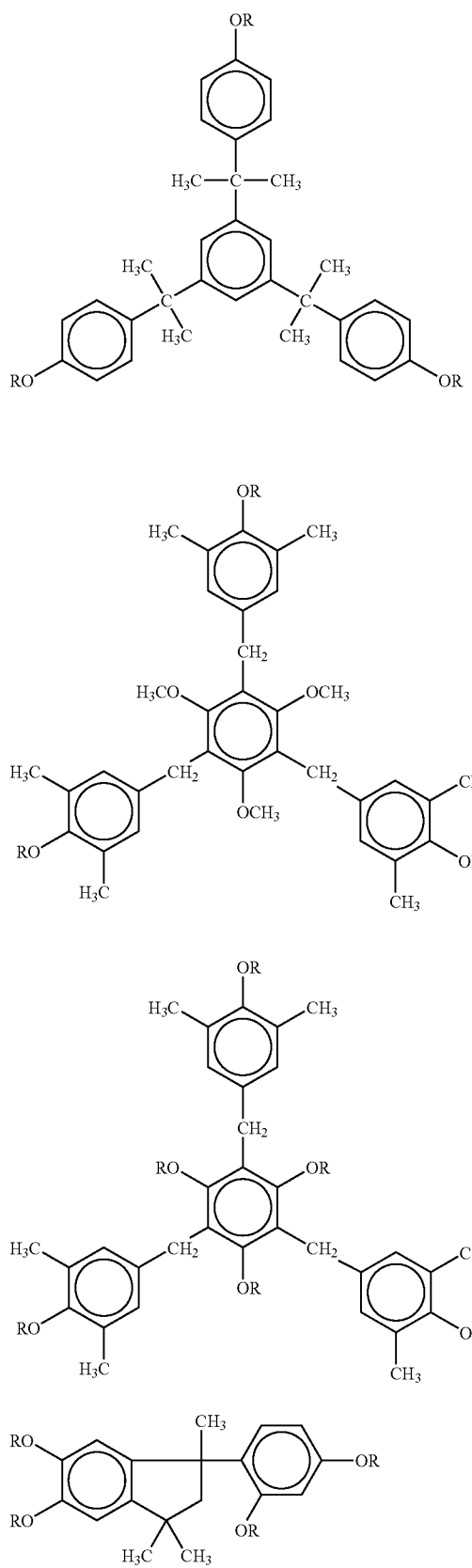
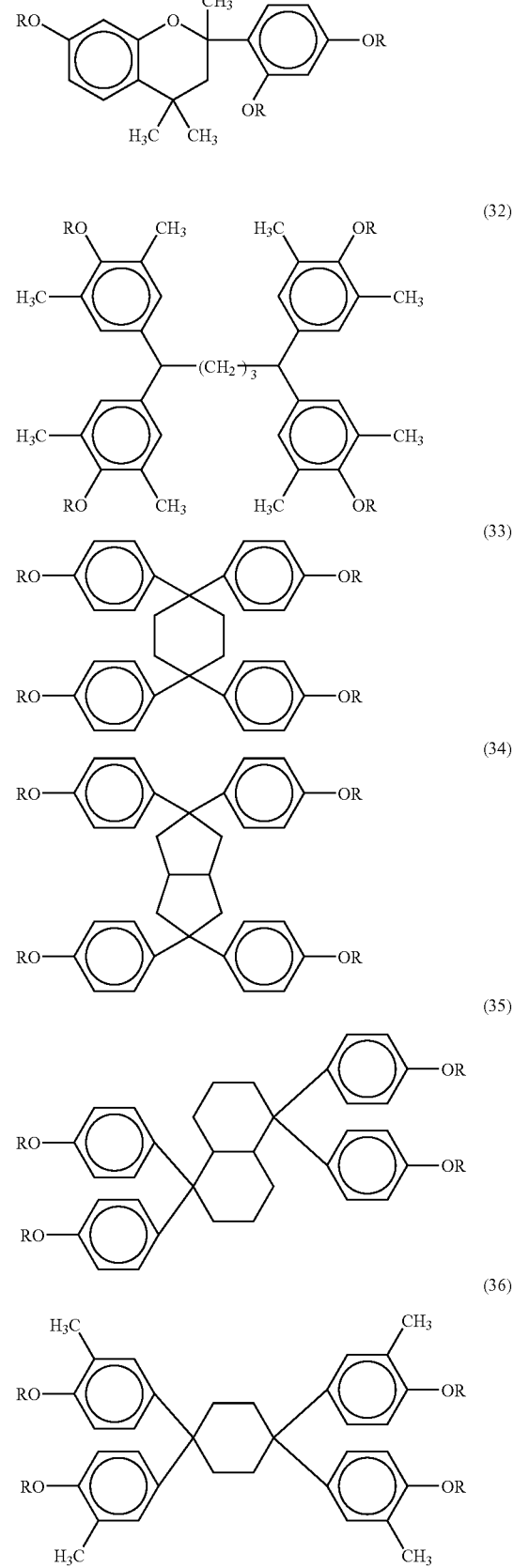

-continued
(37)
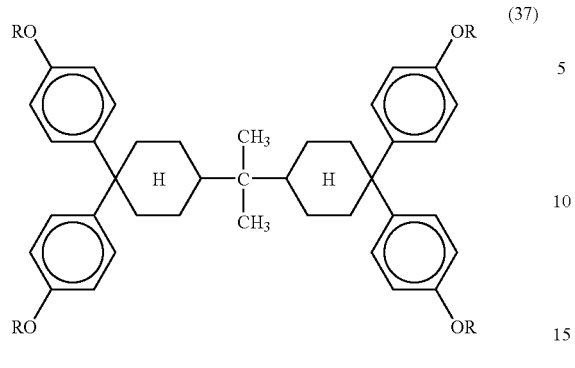
(38)
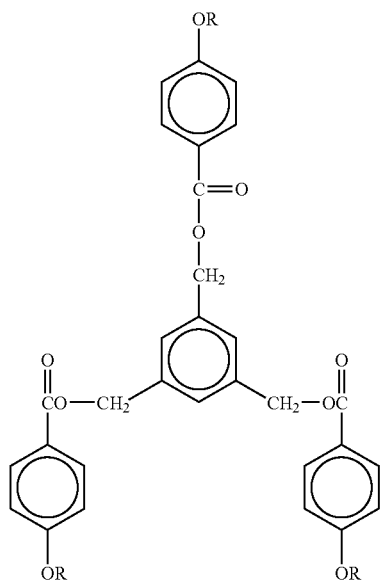
(40)
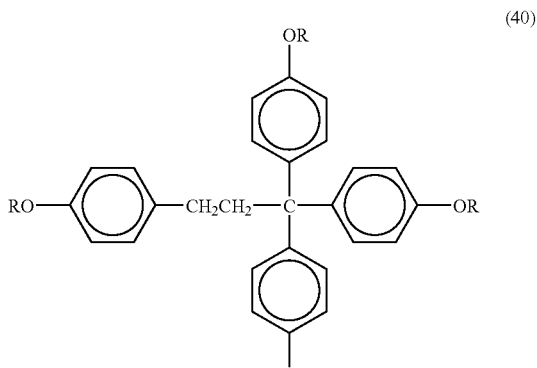
(41)
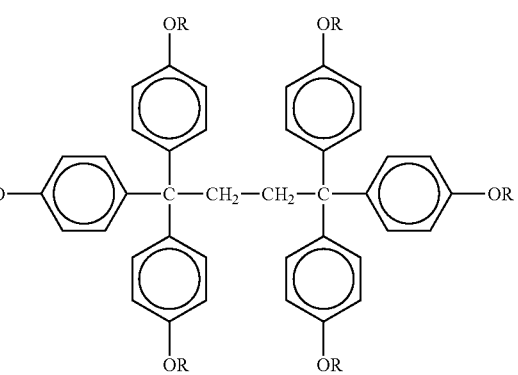
(42)
(39)
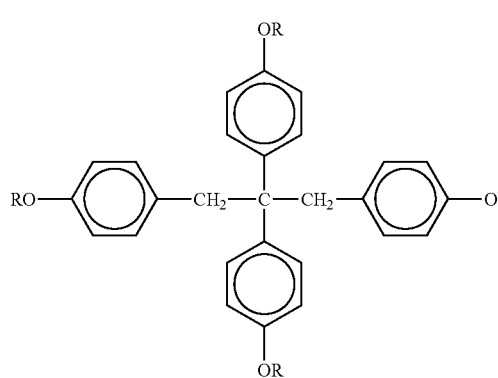
(43)
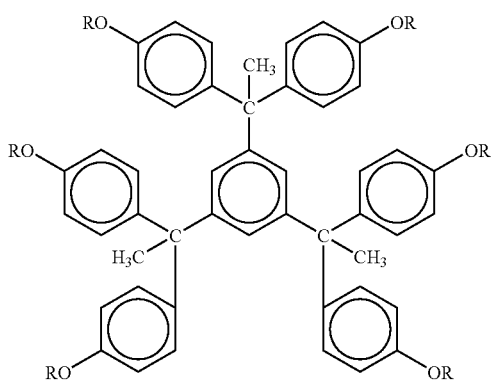

-continued (44)

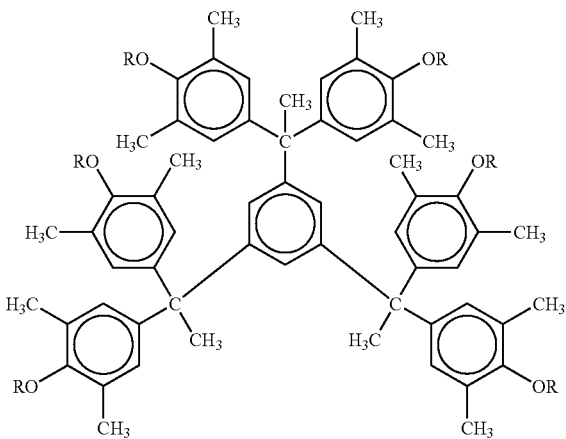

In formulae (1) to (44), R represents a hydrogen atom,

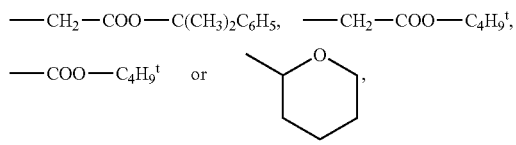

provided that at least two Rs or depending on the structure, three Rs are a group other than a hydrogen atom and that the substituents Rs may not be the same group.

Component (C2):

The component (C2) is described below.

Examples of the component (C2) include compounds when in Compounds [I] to [XI] for the component (C1), $R^{101}$ to $R^{102}$, $R_{108}$ and $R^{130}$ each is a hydrogen atom or $R^{103}$ to $R^{107}$, $R^{109}$, $R^{111}$ to $R^{118}$, $R^{121}$ to $R^{123}$, $R^{128}$, $R^{129}$, $R^{131}$ to $R^{134}$, $R^{138}$ to $R^{141}$ and $R^{143}$ each is hydroxyl group, compounds when in Compound [XII], $R^{146}$ to $R^{149}$ each is a hydroxyl group, compounds when in Compound (XIII), $R^{162}$ to $R^{166}$ each is a hydroxyl group, compounds when in Compound (XIV), $R^{167}$ to $R^{170}$ each is a hydroxyl group, compounds when in Compound (XV), $R^{174}$ to $R^{180}$ each is a hydroxyl group, and compounds when in Compound (XVI), $R^{183}$ to $R^{187}$ each is a hydroxyl group.

Specific examples of the component (C2) include compounds when in Compounds (1) to (44) set forth above as specific examples of the component ($C_1$), R is a hydrogen atom.

The molecular weight of the component (C2) is 1,000 or less, preferably from 300 to 1,000, more preferably from 500 to 1,000.

Component (C3):

The component (C3) is described below.

The component (C3) has —(OCH$_2$CH(R$_1$))$_{n1}$OR$_2$ group (wherein R$_1$ represents a hydrogen atom or a methyl group, R$_2$ represents a hydrogen atom or a monovalent organic group, and n1 represents an integer of 1 to 10; hereinafter sometimes referred to as a "group represented by formula (C3)").

Examples of the monovalent organic group represented by R$_2$ include an alkyl group (preferably having from 1 to 8 carbon atoms), a cycloalkyl group (preferably having from 3 to 8 carbon atoms) and an aryl group (preferably having from 6 to 10 carbon atoms). The alkyl group, cycloalkyl group and aryl group each may have a substituent such as halogen atom, hydroxyl group and carboxyl group.

n1 represents an integer of 1 to 10, preferably from 2 to 4.

Examples of the component (C3) include compounds when in Compounds [I] to [XI] for the component (C1), OR$^{101}$, OR$^{102}$, OR$^{108}$ and OR$^{130}$ each is a group represented by formula (C3) or $R^{103}$ to $R^{107}$, $R^{109}$, $R^{111}$ to $R^{118}$, $R^{121}$ to $R^{123}$, $R^{128}$, $R^{129}$, $R^{131}$ to $R^{134}$, $R^{138}$ to $R^{141}$ and $R^{143}$ each is a group represented by formula (C3), compounds when in Compound [XII], $R^{146}$ to $R^{149}$ each is a group represented by formula (C3), compounds when in Compound (XIII), $R^{162}$ to $R^{166}$ each is a group represented by formula (C3), compounds when in Compound (XIV), $R^{167}$ to $R^{170}$ each is a group represented by formula (C3), compounds when in Compound (XV), $R^{174}$ to $R^{180}$ each is a group represented by formula (C3), and compounds when in Compound (XVI), $R^{183}$ to $R^{187}$ each is a group represented by formula (C3).

Specific examples of the component (C3) include compounds when in Compounds (1) to (44) set forth above as specific examples of the component (C1), OR is a group represented by formula (C3).

The molecular weight of the component (C3) is 2,000 or less, preferably from 300 to 2,000, more preferably from 500 to 2,000.

The content of the component (C) is preferably from 5 to 30% by weight, more preferably from 10 to 20% by weight, based on the solid content of the positive resist composition.

[4] Solvent

The resist composition of the present invention is dissolved in a solvent which can dissolve respective components, and then coated on a support. Usually, the solid content concentration of the total resist composition component is preferably from 2 to 30% by weight, more preferably from 3 to 25% by weight.

Preferred examples of the solvent used here include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used individually or in combination of two or more thereof.

[5] Nitrogen-Containing Basic Compound (Component E)

In the present invention, a nitrogen-containing basic compound is preferably used from the standpoint of, for example, enhancing the performances such as resolution or enhancing the storage stability.

The nitrogen-containing basic compound which can be preferably used in the present invention is a compound having a basicity stronger than phenol.

The preferred chemical environment includes structures of the following formulae (A) to (E). Each structure of formulae (B) to (E) may form a part of a ring structure.

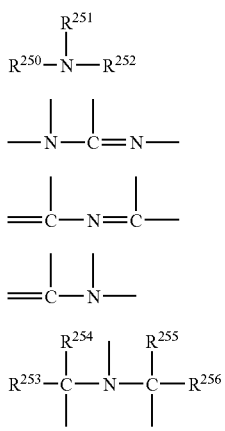

(A)
(B)
(C)
(D)
(E)

In these formulae, $R^{250}$, $R^{251}$ and $R^{252}$, which may be the same or different, each represents a hydrogen atom, an alkyl group having from 1 to 20 carbon atoms, a cycloalkyl group having from 3 to 20 carbon atoms or an aryl group having from 6 to 20 carbon atoms, and $R^{251}$ and $R^{252}$ may combine with each other to form a ring. The alkyl group, cycloalkyl group and aryl group represented by $R^{250}$, $R^{251}$ and $R^{252}$ each may have a substituent. Examples of the alkyl group having a substituent include an aminoalkyl group having from 1 to 20 carbon atoms and a hydroxyalkyl group having from 1 to 20 carbon atoms, and examples of the cycloalkyl group having a substituent include an aminocycloalkyl group having from 3 to 20 carbon atoms and a hydroxycycloalkyl group having from 3 to 20 carbon atoms.

$R^{253}$, $R^{254}$, $R^{255}$ and $R^{256}$, which may be the same or different, each represents an alkyl group having from 1 to 20 carbon atoms or a cycloalkyl group having from 3 to 20 carbon atoms.

The compound is more preferably a nitrogen-containing basic compound having two or more nitrogen atoms differing in the chemical environment within one molecule, still more preferably a compound containing both a substituted or unsubstituted amino group and a ring structure containing a nitrogen atom, or a compound containing an alkylamino group.

Specific preferred examples thereof include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, an imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine, and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Particularly preferred examples of the compound include, but are not limited to, guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine and N-(2-aminoethyl)morpholine.

A tetraalkylammonium salt-type nitrogen containing basic compound can also be used. In particular, a tetraalkylammonium hydroxide having from 1 to 8 carbon atoms, such as tetramethylammonium hydroxide, tetraethylammonium hydroxide, tetra-(n-butyl)ammonium hydroxide, is preferred.

These nitrogen-containing basic compounds are used individually or in combination of two or more thereof.

The ratio of the acid generator and the nitrogen-containing basic compound used in the composition is preferably (total amount of acid generators)/(nitrogen-containing basic compound) (by mol)=2.5 to 300. By setting this molar ratio to 2.5 to 300, the resolution can be enhanced. The (acid generator)/(nitrogen-containing basic compound) ratio (by mol) is more preferably from 5.0 to 200, still more preferably from 7.0 to 150.

[6] Surfactants

In the present invention, surfactants can be used and use of the surfactants is preferred in view of film-forming property, adhesion of pattern, reduction in development defects, and the like.

Specific examples of the surfactant include nonionic surfactants such as polyoxyethylene alkyl ethers (e.g., polyoxyethylene lauryl ether, polyoxyethylene stearyl ether, polyoxyethylene cetyl ether, polyoxyethylene oleyl ether), polyoxyethylene alkylaryl ethers (e.g., polyoxyethylene octylphenol ether, polyoxyethylene nonylphenol ether), polyoxyethylene•polyoxypropylene block copolymers, sorbitan fatty acid esters (e.g., sorbitan monolaurate, sorbitan monopalmitate, sorbitan monostearate, sorbitan monooleate, sorbitan trioleate, sorbitan tristearate) and polyoxyethylene sorbitan fatty acid esters (e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate); fluorine-containing or silicon-containing surfactants such as EFtop EF301, EF303, EF352 (produced by Shin Akita Chemical Co., Ltd.), Megafac F171, F173 (produced by Dainippon Ink & Chemicals, Inc.), Florad FC430, FC431 (produced by Sumitomo 3M Inc.), Asahiguard AG710, Surflon S-382, SC101, SC102, SC103, SC104, SC105 and SC106 (produced by Asahi Glass Co., Ltd.) and Troysol S-366 (produced by Troy Chemical Industries, Inc.); organosiloxane polymer KP-341 (produced by Shin-Etsu Chemical Co., Ltd.); and acrylic acid-based or methacrylic acid-based (co)polymer Polyflow No. 75 and No. 95 (produced by Kyoei Yusi Kagaku Kogyo Co., Ltd.). The amount of the surfactant blended is usually 2 parts by weight or less, preferably 1 part by weight or less, per 100 parts by weight of the solid content in the composition of the present invention.

These surfactants may be used individually or some of these may be added in combination.

As for the surfactant, the composition preferably contains any one fluorine- and/or silicon-containing surfactant (a fluorine-containing surfactant, a silicon-containing surfactant or a surfactant containing both a fluorine atom and a silicon atom), or two or more thereof.

Examples of this surfactant include the surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant which can be used include fluorine-containing or silicon-containing surfactants such as EFtop EF301 and EF303 (produced by Shin-Akita Chemical Co., Ltd.), Florad FC430 and 431 (produced by Sumitomo 3M Inc.), Megafac F171, F173, F176, F189 and R08 (produced by Dainippon Ink & Chemicals, Inc.), Surflon S-382, SC101, 102, 103, 104, 105 and 106 (produced by Asahi Glass Co., Ltd.), and Troysol S-366 (produced by Troy Chemical Industries, Inc.). In addition, polysiloxane polymer KP-341 (produced by Shin-Etsu Chemical Co., Ltd.) may also be used as a silicon-containing surfactant.

Other than those known surfactants, surfactants using a polymer having a fluoro-aliphatic group, which is derived from a fluoro-aliphatic compound produced by telomerization (also called telomer process) or oligomerization (also called oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with (poly(oxyalkylene)) acrylate and/or (poly(oxyalkylene)) methacrylate and the polymer may have an irregular distribution or may be a block copolymer. Examples of the poly(oxyalkylene) group include a poly (oxyethylene) group, a poly(oxypropylene) group and a poly(oxybutylene) group). This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer and a (poly(oxyalkylene)) acrylate (or methacrylate) may be not only a binary copolymer but also a ternary or higher copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F178, F-470, F-473, F-475, F-476 and F-472 (produced by Dainippon Ink & Chemicals, Inc.), copolymers of an acrylate (or methacrylate) having $C_6F_{13}$ group and a (poly(oxyalkylene)) acrylate (or methacrylate), copolymers of an acrylate (or methacrylate) having $C_6F_{13}$ group, a (poly(oxyethylene)) acrylate (or methacrylate) and a (poly(oxypropylene)) acrylate (or methacrylate), copolymers of an acrylate (or methacrylate) having $C_8F_{17}$ group and a (poly(oxyalkylene)) acrylate (or methacrylate), and copolymers of an acrylate (or methacrylate) having $C_8F_{17}$ group, a (poly(oxyethylene)) acrylate (or methacrylate) and a (poly(oxypropylene)) acrylate (or methacrylate).

The amount of the surfactant used is preferably from 0.0001 to 2% by weight, more preferably from 0.001 to 1% by weight, based on the total amount of the positive resist composition (excluding solvent).

[7] Other Components

The positive resist composition of the present invention may contain, if desired, a dye, a photo-base generator and the like.

1. Dye

In the present invention, a dye can be used.

Suitable dyes include an oily dye and a basic dye. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all produced by Orient Chemical Industries Co., Ltd.), Crystal Violet (CI42555), Methyl Violet (CI42535), Rhodamine B (CI45170B), Malachite Green (CI42000) and Methylene Blue (CI52015).

2. Photo-Base Generator

Examples of the photo-base generator which can be added to the composition of the present invention include the compounds described in JP-A-4-151156, JP-A-4-162040, JP-A-5-197148, JP-A-5-5995, JP-A-6-194834, JP-A-8-146608, JP-A-10-83079 and European Patent 622,682. Specific examples of the photo-base generator which can be suitably used include 2-nitrobenzyl carbamate, 2,5-dinitrobenzylcyclohexyl carbamate, N-cyclohexyl-4-methylphenylsulfonamide and 1,1-dimethyl-2-phenylethyl-N-isopropyl carbamate. The photo-base generator is used for the purpose of improving the resist profile or the like.

In the present invention, a commercially available inorganic or organic antireflection film may be used, if desired. Furthermore, an antireflection film may be used by coating it as a lower layer of the resist.

The antireflection film used as the lower layer of the resist may be either an inorganic film such as titanium, titanium dioxide, titanium nitride, chromium oxide, carbon and amorphous silicon, or an organic film comprising a light absorbent and a polymer material. The former requires equipment for the film formation, such as vacuum vapor-deposition apparatus, CVD apparatus and sputtering apparatus. Examples of the organic antireflection film include a film comprising a diphenylamine derivative and formaldehyde-modified melamine resin condensate, an alkali-soluble resin and a light absorbent described in JP-B-7-69611 (the term "JP-B" as used herein means an "examined Japanese patent publication"), a reaction product of a maleic anhydride copolymer and a diamine-type light absorbent described in U.S. Pat. No. 5,294,680, a film comprising a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-based light absorbent described in JP-A-8-87115, and a film obtained by adding a low molecular light absorbent to a polyvinyl alcohol resin described in JP-A-8-179509.

Also, the organic antireflection film may be a commercially available organic antireflection film such as DUV-30 Series, DUV-40 Series (produced by Brewer Science, Inc.), AR-2, AR-3 and AR-5 (produced by Shipley Co., Ltd.).

[8] Pattern Formation Method

In the production of a precision integrated circuit device, the step of forming a pattern on a resist film is performed by coating the positive resist composition of the present invention on a substrate (for example, silicon/silicon dioxide-coated substrate, glass substrate, ITO substrate or quartz/chromium oxide-coated substrate) to form a resist film, irradiating it with electron beams, EUV light or X rays, and then subjecting the resist film to heating, development, rinsing and drying, whereby a good resist pattern can be formed.

The developer which can be used for the positive resist composition of the present invention is an aqueous solution (0.1 to 20% by weight) of an alkali such as inorganic alkalis (e.g., sodium hydroxide, potassium hydroxide, sodium carbonate, sodium silicate, sodium metasilicate, aqueous ammonia), primary amines (e.g., ethylamine, n-propylamine), secondary amines (e.g., diethylamine, di-n-butylamine), tertiary amines (e.g., triethylamine, methyldiethylamine), alcohol amines (e.g., dimetylethanolamine, triethanolamine), quaternary ammonium salts (e.g., tetramethylammonium hydroxide, tetraethylammonium hydroxide, choline) and cyclic amines (e.g., pyrrole, piperidine). In this aqueous solution of an alkali, an alcohol such as isopropyl alcohol and a surfactant such as nonionic surfactant may be added each in an appropriate amount.

Among these developers, preferred are quaternary ammonium salts, more preferred are tetramethylammonium hydroxide and choline.

EXAMPLES

The present invention is described in greater detail below by referring to Examples, but the present invention should not be construed as being limited thereto.

Synthesis Example 1

Synthesis of Resin (P1)

In 40 ml of methanol, 6.23 g (0.035 mol) of p-acetoxystyrene, 8.20 g (0.035 mol) of 2-methyl-2-adamantyl methacrylate and 10.8 g (0.030 mol) of [3,3,3-trifluoro-2-hydroxy-2-(trifluoromethyl)propyl]bicyclo[2.2.1]hept-2-yl methacrylate were dissolved. The resulting solution was stirred in a nitrogen stream and after adding 0.25 g of azobisisobutylnitrile (AIBN) at 70° C., continuously stirred for 12 hours, thereby performing the polymerization. Subsequently, dimethylaminopyridine was added to the reaction solution to cut the acetoxy group and then, the volatile content was removed by distillation under reduced pressure. The obtained resin was again dissolved in 150 ml of methanol and the resulting solution was added to a large amount of water to obtain a white polymer. An operation of again dissolving this polymer in methanol and adding the resulting solution to a large amount of water was repeated three times. The obtained resin was dried at 35° C. for 24 hours in a vacuum dryer, as a result, Resin (P1) was obtained. The weight average molecular weight of Resin (P1) was 9,600 and the dispersity was 1.35.

Example 1

(i) Preparation of Positive Resist and Formation of Resist Film

| (Component A) | Sulfonic Acid Generator (A-2) | 0.08 g |
| (Component B) | Resin (P1) | 0.916 g |

These components were dissolved in 8.5 g of propylene glycol monomethyl ether acetate. Thereto, 0.003 g of E-1 (shown below) as a nitrogen-containing basic compound, which was dissolved in 7.0 g of propylene glycol monomethyl ether acetate and 1.5 g of propylene glycol monomethyl ether, was added and 0.001 g of W-1 (shown below) as a surfactant was further added and dissolved. The resulting solution was microfiltered through a membrane filter having an opening size of 0.1 μm to obtain a resist solution. In this resist, the contents of the resin and the sulfonic acid generator were 91.6% by weight and 8.0% by weight, respectively, based on the solid content of the resist.

The obtained resist solution was coated on a 6-inch silicon wafer by using a spin coater (Mark 8, manufactured by Tokyo Electron Ltd.) and then baked at 110° C. for 90 seconds to obtain a 0.30 μm-thick resist film.

(ii) Production and Evaluation of Positive Resist Pattern

This resist film was irradiated with electron beams by using an electron beam image-drawing apparatus (HL750, manufactured by Hitachi Ltd., accelerating voltage: 50 KeV). After the irradiation, the resist film was baked at 110° C. for 90 seconds, dipped in an aqueous 2.38% by weight tetramethylammonium hydroxide (TMAH) solution for 60 seconds, rinsed with water for 30 seconds and then dried. The obtained pattern was evaluated by the following methods.

Sensitivity

The cross-sectional profile of the pattern obtained was observed by using a scanning electron microscope (S-4300, manufactured by Hitachi, Ltd.). The minimum irradiation energy when resolving a 0.15-μm line (line:space=1:1) was defined as the sensitivity.

Resolution

The limiting resolution (the line and space were separated and resolved) at the irradiation dosage of giving the above-described sensitivity was defined as the resolution.

Pattern Profile

The cross-sectional profile of the 0.15 μm-line pattern at the irradiation dosage of giving the above-described sensitivity was observed by using a scanning electron microscope (S-4300, manufactured by Hitachi, Ltd.) and evaluated on a three-stage scale of "rectangular", "slightly tapered" and "tapered".

Line Edge Roughness

Within the region of 50 μm in the longitudinal direction of the 0.15 μm-line pattern at the irradiation dosage of giving the above-described sensitivity, the line width was measured at arbitrary 30 points and the variance thereof was evaluated by 3σ.

(iii) Evaluation Results

The results of Example 1 were very good, that is, the sensitivity was 4.5 μC/cm$^2$, the resolution was 0.10 μm, the pattern profile was rectangular, and the line edge roughness was 6.5 nm.

Examples 2 to 14

Preparation of resist, formation of resist film and evaluation of electron beam exposure were performed thoroughly in the same manner as in Example 1 by using the components shown in Table 1 below. The evaluation results are shown in Table 1.

Comparative Example 1

Preparation of resist, formation of resist film and evaluation of electron beam exposure were performed thoroughly in the same manner as in Example 1 except for using Resin (CR-1) shown below in place of Resin (P1). The evaluation results are shown in Table 1.

Comparative Example 2

Preparation of resist, formation of resist film and evaluation of electron beam exposure were performed thoroughly in the same manner as in Example 8 except for using Resin (CR-2) shown below in place of Resin (P12). The evaluation results are shown in Table 1.

TABLE 1

(CR-1)

(CR-2)

| | Resin (cg) | Acid Generator (cg) | Nitrogen-Containing Basic Compound (cg) | Surfactant (cg) | Component (C) (cg) | Sensitivity ($\mu C/cm^2$) | Resolution ($\mu m$) | Pattern Profile | Line Edge Roughness (nm) |
|---|---|---|---|---|---|---|---|---|---|
| Example 1 | P1 (91.6) | A-2 (8.0) | E-1 (0.3) | W-1 (0.1) | — | 4.5 | 0.10 | rectangular | 6.5 |
| Example 2 | P2 (92.6) | A-3 (7.0) | E-2 (0.3) | W-1 (0.1) | — | 5.5 | 0.10 | rectangular | 5.5 |
| Example 3 | P4 (90.6) | A-15 (9.0) | E-1 (0.3) | W-1 (0.1) | — | 6.0 | 0.11 | rectangular | 6.0 |
| Example 4 | P5 (91.0) | A-17 (8.6) | E-3 (0.3) | W-2 (0.1) | — | 5.5 | 0.10 | rectangular | 6.5 |
| Example 5 | P6 (71.6) | A-22 (8.0) | E-1 (0.3) | W-1 (0.1) | C-1 (20.0) | 5.0 | 0.11 | rectangular | 6.0 |
| Example 6 | P8 (89.6) | A-25 (8.0) AA-1 (2.0) | E-2 (0.3) | W-2 (0.1) | — | 5.5 | 0.10 | rectangular | 6.5 |
| Example 7 | P11 (86.3) | A-15 (8.3) | E-1 (0.3) | W-1 (0.1) | C-2 (5.0) | 6.0 | 0.09 | rectangular | 7.0 |
| Example 8 | P12 (91.1) | A-14 (8.5) | E-3 (0.3) | W-1 (0.1) | — | 5.5 | 0.10 | rectangular | 6.5 |
| Example 9 | P14 (89.6) | A-33 (8.0) AA-1 (2.0) | E-1 (0.3) | W-2 (0.1) | — | 5.5 | 0.10 | rectangular | 5.5 |
| Example 10 | P15 (92.1) | A-25 (7.5) | E-2 (0.3) | W-3 (0.1) | — | 6.0 | 0.11 | rectangular | 6.0 |

TABLE 1-continued (CR-1)

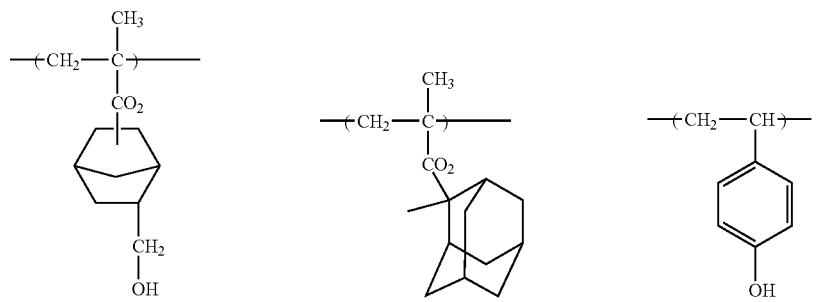

(CR-2)

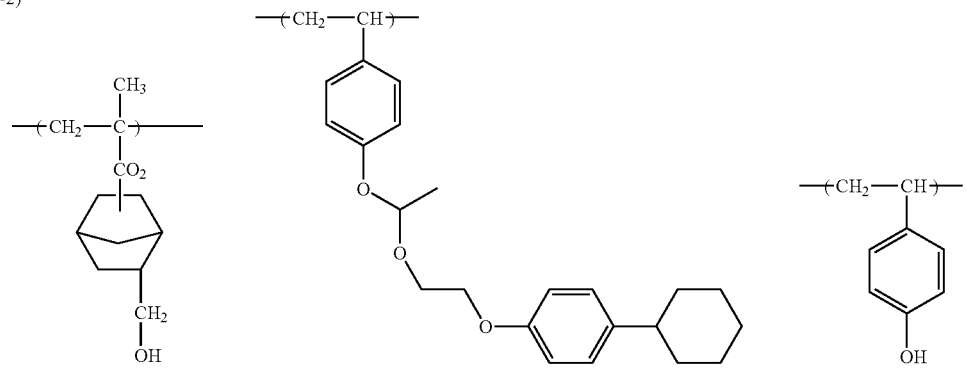

| | Resin (cg) | Acid Generator (cg) | Nitrogen-Containing Basic Compound (cg) | Surfactant (cg) | Component (C) (cg) | Sensitivity (μC/cm²) | Resolution (μm) | Pattern Profile | Line Edge Roughness (nm) |
|---|---|---|---|---|---|---|---|---|---|
| Example 11 | P17 (91.6) | A-24 (8.0) | E-1 (0.3) | W-1 (0.1) | — | 6.5 | 0.10 | rectangular | 6.5 |
| Example 12 | P22 (81.6) | A-41 (8.0) AA-9 (2.0) | E-1 (0.3) | W-1 (0.1) | C-3 (8.0) | 5.5 | 0.10 | rectangular | 6.0 |
| Example 13 | P1 (91.6) | A-78 (8.0) | E-1 (0.3) | W-1 (0.1) | — | 5.0 | 0.09 | rectangular | 6.0 |
| Example 14 | P24 (91.6) | A-81 (8.0) | E-1 (0.3) | W-1 (0.1) | — | 5.5 | 0.09 | rectangular | 6.5 |
| Comparative Example 1 | CR-1 (91.6) | A-2 (8.0) | E-1 (0.3) | W-1 (0.1) | — | 8.0 | 0.15 | slightly tapered | 10.0 |
| Comparative Example 2 | CR-2 (91.1) | A-14 (8.5) | E-3 (0.3) | W-1 (0.1) | — | 8.0 | 0.15 | slightly tapered | 11.5 |

The weight average molecular weight, compositional ratio and dispersity of each resin shown in Table 1 are shown in Table 2.

TABLE 2

| Resin | |
|---|---|
| P1 | Mw = 9600, compositional ratio: 30/35/35, Mw/Mn = 1.35 |
| P2 | Mw = 10600, compositional ratio: 30/35/45, Mw/Mn = 1.35 |
| P4 | Mw = 8800, compositional ratio: 25/35/40, Mw/Mn = 1.50 |
| P5 | Mw = 9900, compositional ratio: 20/35/45, Mw/Mn = 1.45 |
| P6 | Mw = 9000, compositional ratio: 25/35/40, Mw/Mn = 1.55 |
| P8 | Mw = 12500, compositional ratio: 25/35/40, Mw/Mn = 1.60 |
| P11 | Mw = 9000, compositional ratio: 30/35/35, Mw/Mn = 1.75 |

TABLE 2-continued

| Resin | |
|---|---|
| P12 | Mw = 7600, compositional ratio: 25/35/40, Mw/Mn = 1.55 |
| P14 | Mw = 7800, compositional ratio: 25/35/40, Mw/Mn = 1.25 |
| P15 | Mw = 5600, compositional ratio: 20/35/45, Mw/Mn = 1.50 |
| P17 | Mw = 11500, compositional ratio: 25/35/40, Mw/Mn = 1.35 |
| P22 | Mw = 12000, compositional ratio: 30/35/35, Mw/Mn = 1.25 |
| CR-1 | Mw = 9600, compositional ratio: 30/35/35, Mw/Mn = 1.55 |
| CR-2 | Mw = 9600, compositional ratio: 30/20/50, Mw/Mn = 1.38 |

Abbreviations in Table 1 indicate the followings.

Nitrogen-Containing Basic Compound
E-1: tri-n-hexylamine
E-2: 2,4,6-triphenylimidazole
E-3: tetra-(n-butyl)ammonium hydroxide Surfactant
W-1: fluorine-containing surfactant, Megafac F176 produced by Daimippon Ink & Chemicals, Inc.)
W-2: fluorine/silicon-containing surfactant, Megafac R08 produced by Dainippon Ink & Chemicals Co., Ltd.)
W-3: silicon-containing surfactant, polysiloxane polymer KP-341 produced by Shin-Etsu Chemical Co., Ltd.)

Compound of Component (C)
C-1: Compound when in Compound Skeleton (27) of the component (C), R is —CH(CH$_3$)OCH$_2$CH$_2$OPh group.
C-2: Compound when in Compound Skelton (37) of the component (C), R is hydrogen atom.
C-3: Compound when in Compound Skelton (40) of the component (C), R is —CH$_2$CH$_2$OCH$_3$ group.

As seen from Table 1, with respect to the pattern formation by the electron beam irradiation, the positive resist composition of the present invention exhibits high sensitivity and high resolution and also is excellent in the pattern profile and line edge roughness as compared with the compositions of Comparative Examples.

Examples 15 to 16 and Comparative Examples 3 and 4

By using each resist composition of Examples 1 and 8 and Comparative Examples 1 and 2, a resist film was obtained in the same manner as in Example 1 except that the resist film thickness was 0.15 μm. The resist film obtained was plane-exposed by using EUV light (wavelength: 13 nm) while changing the exposure amount in steps of 0.5 mJ in the range from 0 to 5.0 mJ and then baked at 110° C. for 90 seconds. Thereafter, the dissolution rate at each exposure amount was measured by using an aqueous 2.38% by weight tetramethylammonium hydroxide (TMAH) solution to obtain a sensitivity curve. In this sensitivity curve, the exposure amount when the dissolution rate of the resist was saturated was designated as the sensitivity. Also, from the gradient in the straight line part of the sensitivity curve, the dissolution contrast (γvalue) was calculated. As the γvalue is larger, the dissolution contrast is more excellent.

Subsequently, a sample irradiated with EUV light at an exposure amount corresponding to ½ of the sensitivity determined in the experiment above was prepared and after developing it with an aqueous 2.38% by weight tetramethylammonium hydroxide (TMAH) solution for 60 seconds, the surface of the resist film was observed by an atomic force microscope. Rank A is good, B is slightly good, and C is bad with large roughness.

The results are shown in Table 3 below.

TABLE 3

|  | Sensitivity (mJ/cm$^2$) | γ Value | Surface Roughness |
|---|---|---|---|
| Example 15 | 2.5 | 8.5 | A |
| Example 16 | 2.4 | 8.5 | A |
| Comparative Example 3 | 4.2 | 6.5 (insolubilized in high-exposure area) | C |
| Comparative Example 4 | 4.5 | 8.5 (insolubilized in high-exposure area) | C |

It is seen from Table 3 that in the characteristic evaluation by the irradiation with EUV light, the positive resist composition of the present invention is ensured with high sensitivity and high contrast, free of insolubilization in the high-exposure area, prevented from negative conversion and excellent also in the surface roughness as compared with the compositions of Comparative Examples.

According to the present invention, a positive resist composition for use with an electron beam, EUV light or an X ray, having high sensitivity and high resolution and being excellent in the pattern profile, line edge roughness, dissolution contrast, surface roughness and prevention of negative conversion, and a pattern formation method using the composition can be provided.

The entire disclosure of each and every foreign patent application from which the benefit of foreign priority has been claimed in the present application is incorporated herein by reference, as if fully set forth.

What is claimed is:

1. A positive resist composition for use with an electron beam, an EUV light or an X ray, the positive resist composition comprising:
   (A) at least one compound that generates an acid upon treatment with one of an actinic ray and radiation; and
   (B) a resin that increases a solubility of the resin (B) in an alkaline developer by an action of an acid,
   wherein the resin (B) consists essentially of a repeating unit represented by formula (II) and having an alicyclic group connected with a fluorine-substituted alcohol residue and a repeating unit represented by formula (B3):

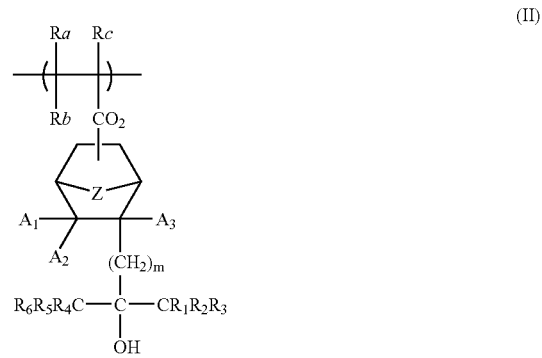

wherein Ra and Rb each independently represents a hydrogen atom, an alkyl group, a cyano group, a chlorine atom or a fluorine atom;
A$_1$ to A$_3$ each independently represents a hydrogen atom, an alkyl group or a fluorine atom;

$R_1$ to $R_6$ each independently represents a hydrogen atom or a fluorine atom, provided that at least one of $R_1$ to $R_6$ represents a fluorine atom;

Z represents an alkylene group, an oxygen atom or a sulfur atom;

m represents an integer of 0 to 2; and

Rc represents a hydrogen atom or an unsubstituted methyl group;

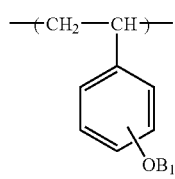
(B3)

2. The positive resist composition according to claim 1, wherein $R_1$ to $R_6$ each represents a fluorine atom.

3. The positive resist composition according to claim 1, wherein the resin (B) further comprises at least one of a repeating unit represented by formula (B1) and a repeating unit represented by formula (B2):

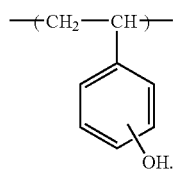
(B1)

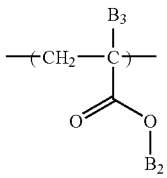
(B2)

wherein $B_1$ and $B_2$ each represents a group capable of decomposing by an action of an acid, or a group including a group capable of decomposing by an action of an acid to generate a carboxyl group or a hydroxyl group; and $B_3$ represents a hydrogen atom, a methyl group, a halogen atom or a cyano group.

4. The positive resist composition according to claim 3, wherein $B_1$ and $B_2$ each includes a cyclic structure.

5. A pattern formation method comprising:

forming a resist film from a positive resist composition according to claim 1;

exposing the resist film with an electron beam, an EUV light or an X ray, so as to form an exposed resist film; and developing the exposed resist film.

6. The positive resist composition according to claim 1, which contains said at least one compound (A) in an amount of from 6 to 20% by weight based on a total solid content of the positive resist composition.

7. The positive resist composition according to claim 1, wherein said at least one compound (A) comprises: a compound that generates a sulfonic acid upon treatment with one of an actinic ray and radiation; and a compound that generates a carboxylic acid upon treatment with one of an actinic ray and radiation.

* * * * *